(12) United States Patent
Ueno

(10) Patent No.: US 8,811,089 B2
(45) Date of Patent: Aug. 19, 2014

(54) NONVOLATILE SEMICONDUCTOR MEMORY DEVICE

(75) Inventor: Koki Ueno, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 205 days.

(21) Appl. No.: 13/424,788

(22) Filed: Mar. 20, 2012

(65) Prior Publication Data

US 2013/0077408 A1 Mar. 28, 2013

(30) Foreign Application Priority Data

Sep. 27, 2011 (JP) ................. 2011-211037

(51) Int. Cl.
*G11C 11/34* (2006.01)
*G11C 16/34* (2006.01)
*G11C 11/56* (2006.01)
*G11C 16/08* (2006.01)
*G11C 16/04* (2006.01)
*G11C 16/10* (2006.01)
*G11C 16/28* (2006.01)
*G11C 16/16* (2006.01)

(52) U.S. Cl.
CPC ........ *G11C 16/3454* (2013.01); *G11C 11/5628* (2013.01); *G11C 16/08* (2013.01); *G11C 16/0483* (2013.01); *G11C 16/10* (2013.01); *G11C 16/28* (2013.01); *G11C 16/16* (2013.01)
USPC ............ 365/185.22; 365/185.03; 365/185.12; 365/185.14; 365/185.17; 365/185.18; 365/185.19; 365/185.24; 365/185.28; 365/185.33

(58) Field of Classification Search
CPC ............... G11C 11/5628; G11C 16/08; G11C 16/0483; G11C 16/10; G11C 16/28; G11C 16/3454; G11C 16/16
USPC ............ 365/185.03, 185.11, 185.17, 185.18, 365/185.19, 185.2, 185.22, 185.23, 185.24, 365/185.33
See application file for complete search history.

(56) References Cited

U.S. PATENT DOCUMENTS 6,744,670 B2 6/2004 Tamada et al.
7,652,928 B2 1/2010 Yanagidaira et al.
(Continued)

FOREIGN PATENT DOCUMENTS

JP 8-203286 A 8/1996
JP 2000-76878 3/2000
(Continued)

OTHER PUBLICATIONS

Japanese Office Action Issued Apr. 2, 2013 in Patent Application No. 2011-211037 (with English translation).
U.S. Appl. No. 13/227,050, filed Sep. 7, 2011, Yasuhiro Shiino, et al.

*Primary Examiner* — Fernando Hidalgo
(74) *Attorney, Agent, or Firm* — Oblon, Spivak, McClelland, Maier & Neustadt, L.L.P.

(57) ABSTRACT

A nonvolatile semiconductor memory device according to the embodiment comprises a memory cell array including plural memory cells operative to store data nonvolatilely in accordance with plural different threshold voltages; and a control unit operative to, in data write to the memory cell, execute write loops having a program operation for changing the threshold voltage of the memory cell and a verify operation for detecting the threshold voltage of the memory cell after the program operation, the control unit, in data write for changing one threshold voltage of the plural threshold voltages, executing the verify operation, when the number of write loops to the memory cell becomes more than a certain defined number, using a condition that can pass the verify operation easier than that when the number of write loops is equal to or less than the certain defined number.

19 Claims, 20 Drawing Sheets

(56) References Cited

U.S. PATENT DOCUMENTS

| | | |
|---|---|---|
| 8,081,512 B2 | 12/2011 | Ueno et al. |
| 2003/0151950 A1 | 8/2003 | Tamada et al. |
| 2008/0137435 A1* | 6/2008 | Kim et al. .............. 365/185.22 |
| 2011/0007572 A1 | 1/2011 | Ueno et al. |
| 2011/0292724 A1* | 12/2011 | Kim ..................... 365/185.03 |
| 2012/0002475 A1 | 1/2012 | Ueno et al. |

FOREIGN PATENT DOCUMENTS

| | | |
|---|---|---|
| JP | 2000-113686 | 4/2000 |
| JP | 2003-242787 | 8/2003 |
| JP | 2007-323716 | 12/2007 |
| JP | 2008-27511 | 2/2008 |

* cited by examiner

S101: Data Erase

S102: L Page Write

S103: U Page Write

NONVOLATILE SEMICONDUCTOR MEMORY DEVICE

CROSS-REFERENCE TO RELATED APPLICATIONS

This application is based upon and claims the benefit of priority from the prior Japanese Patent Application No. 2011-211037, filed on Sep. 27, 2011, the entire contents of which are incorporated herein by reference.

FIELD

The embodiment relates to a nonvolatile semiconductor memory device.

BACKGROUND

A flash memory, one of nonvolatile semiconductor memory devices, uses a transistor having a charge accumulation layer as a memory cell. This memory cell can nonvolatilely store different data in accordance with the amounts of charge accumulated in the charge accumulation layer.

Even though the flash memory can nonvolatilely store data, however, it discharges the accumulated charge gradually after left for long time. As a result, the threshold voltage of the memory cell is reduced.

There is a data write method of programming the threshold voltage of a memory cell slightly higher previously in expectation of the reduction in the threshold voltage due to long time leaving. In programming the threshold voltage of a memory cell slightly higher, however, the number of write loops until verify-pass increases naturally. As a result, the memory cell cannot finish programming and may cause a write error.

DETAILED DESCRIPTION

A nonvolatile semiconductor memory device according to the embodiment comprises a memory cell array including plural memory cells operative to store data nonvolatilely in accordance with plural different threshold voltages; and a control unit operative to, in data write to the memory cell, execute write loops having a program operation for changing the threshold voltage of the memory cell and a verify operation for detecting the threshold voltage of the memory cell after the program operation, the control unit, in data write for changing one threshold voltage of the plural threshold voltages, executing the verify operation, when the number of write loops to the memory cell becomes more than a certain defined number, using a condition that can pass the verify operation easier than that when the number of write loops is equal to or less than the certain defined number.

Hereinafter, nonvolatile semiconductor memory devices according the embodiments will be descried with reference to the drawings.

First Embodiment

General Configuration

First, a general configuration is described on a nonvolatile semiconductor memory device according a first embodiment.

Figure 1:
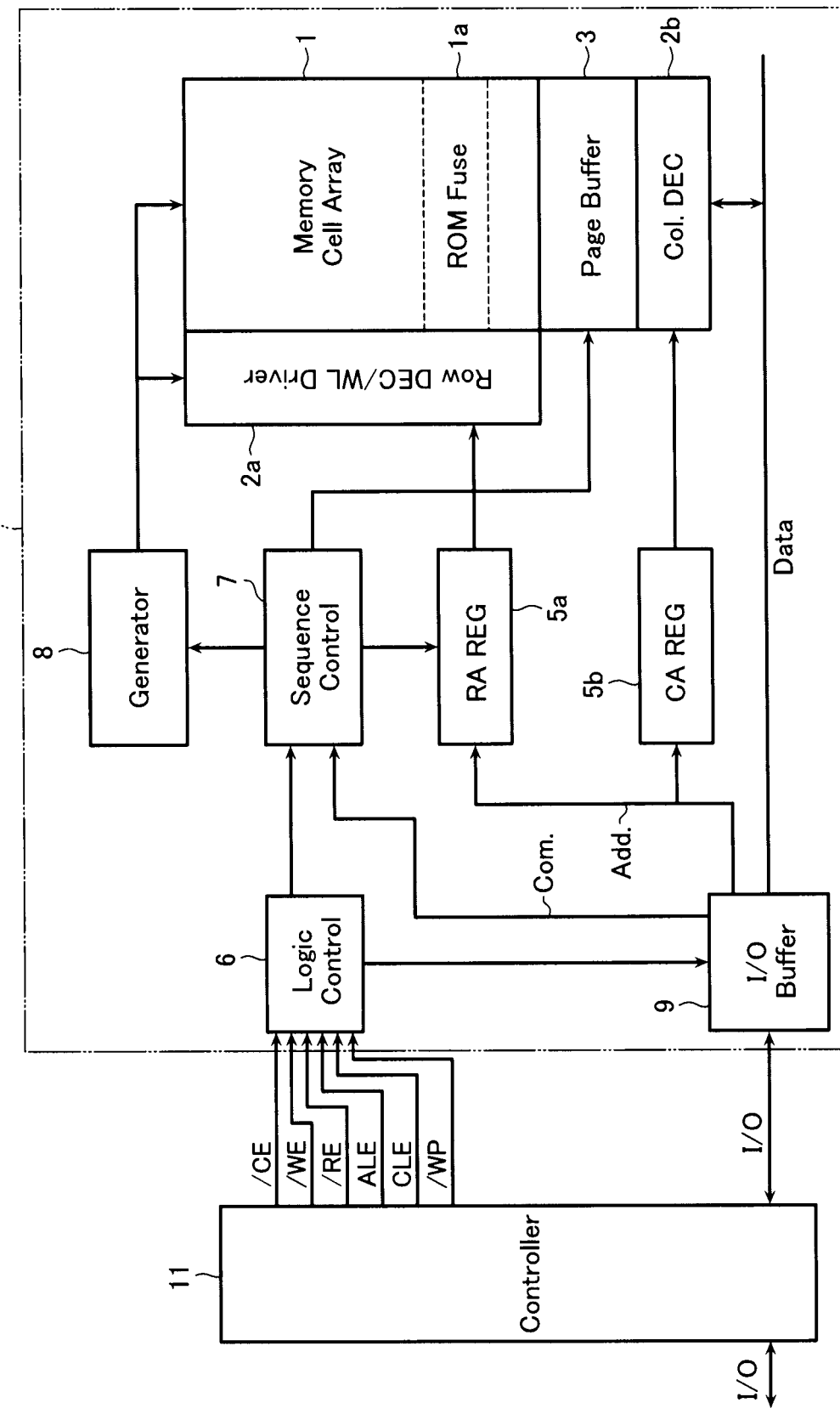
FIG. 1 is a block diagram of a nonvolatile semiconductor memory device according to a first embodiment.

FIG. 1 is a block diagram of the nonvolatile semiconductor memory device according the present embodiment.

This NAND-type flash memory comprises a NAND chip 10, and a controller 11 operative to control the NAND chip 10.

A memory cell array 1 contained in the NAND chip 10 includes plural memory cells having a charge accumulation layer each and arranged in a matrix as described later. If required, the memory cell array 1 may include a ROM fuse area 1a not accessible from the user. The ROM fuse area 1a is used to store various information for control of the device at the time of data write and so forth.

On the periphery of the memory cell array 1, a row decoder/word line driver 2a, a column decoder 2b, a page buffer 3 and a voltage generator circuit 8 are arranged. The row decoder/word line driver 2a, the column decoder 2b, the page buffer 3 and the voltage generator circuit 8 are contained in a data write unit, which executes data write or read to the memory cell array 1 on a page basis.

The row decoder/word line driver 2a drives word lines and selection gate lines in the memory cell array 1. The page buffer 3 includes sense amp circuits and data holder circuits for 1 page. Pieces of data on 1 page read out from the page buffer 3 are column-selected in order by the column decoder 2b and provided to an external I/O terminal via an I/O buffer 9. Pieces of write data supplied from the I/O terminal are selected by the column decoder 2b and loaded into the page buffer 3. The page buffer 3 is loaded with write data on 1 page. A row address signal and a column address signal are fed via the I/O buffer 9 and transferred to the row decoder 2a and the column decoder 2b, respectively. A row address register 5a holds an erase block address and holds a page address. A column address register 5b receives a top column address for write data loading before the beginning of a write sequence, and a top column address for a read sequence. Until the write enable /WE and the read enable /RE are toggled under a certain condition, the column address register 5b holds the input column address.

A logic control circuit 6 receives commands sent from a controller 11, including control signals and so forth, such as a chip enable signal /CE, a command enable signal CLE, an address latch enable signal ALE, a write enable signal /WE and a read enable signal /RE. Based on the commands, it controls the input of addresses and the input/output of data. When the control circuit 6 receives a command, it provides an instruction to a sequence control circuit 7 so as to execute a read operation and a write or erase sequence control. When the voltage generator circuit 8 is controlled by the sequence control circuit 7, it generates certain voltages for various operations.

The controller 11 executes control on data write and read under a condition appropriate for the current written state of the NAND chip 10. A part of a write sequence later described may be executed in the NAND chip 10.

<Memory Cell Array>

Described next is the memory cell array 1 in the nonvolatile semiconductor memory device according to the present embodiment.

Figure 2:
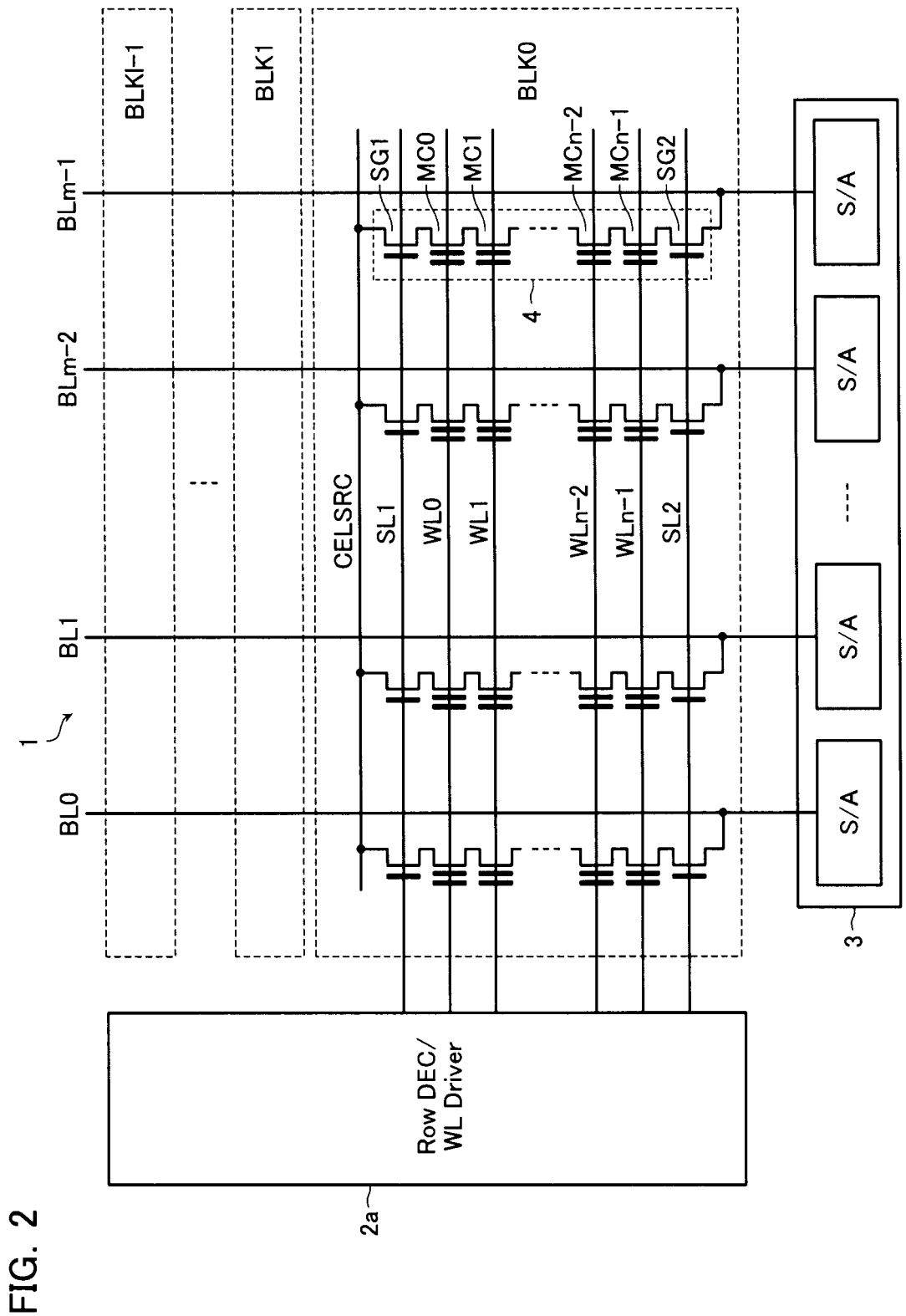
FIG. 2 is a circuit diagram of a memory cell array in the nonvolatile semiconductor memory device according to the same embodiment.

FIG. 2 is a circuit diagram of the memory cell array 1. In the case of FIG. 2, serially connected n memory cells MC0 to MCn-1 (n is a natural number) and selection gate transistors SG1, SG2 connected to both ends thereof configure a NAND string 4. The selection gate transistor SG0 has a source connected to a common source line CELSRC, and the selection gate transistor SG1 has a drain connected to a bit line BL (BL0 to BLm-1). Memory cells MC0 to MCn-1 have respective control gates connected to word lines WL (WL0 to WLn-1), and the selection gate transistors SG1, SG2 have respective gates connected to selection gate lines SL1, SL2.

Plural memory cells MC sharing one word line WL form a page, that is, a unit of batch data read and write. Plural NAND strings 4 aligned in the word line WL direction configure a block BLK, that is, a unit of batch data erase. In FIG. 2, plural blocks BLK0 to BLK1-1 are arranged such that NAND strings 4 adjacently arranged in the bit line BL direction share a bit line BL, thereby configuring the cell array 1. The word lines WL and the selection gate lines SL0, SL1 are driven by the row decoder 2a. Each bit line BL is connected to a sense amp circuit S/A in the page buffer 3.

The following description is given to a "page", that is, a unit of access in such the NAND-type flash memory. In the following description, take note that the "page" has two different meanings.

The first is a "page" composed of plural memory cells MC sharing one word line, that is, a unit of data access. The second is a "page" indicative of the hierarchy of stored data when one memory cell stores plural bits of data. In this case, it is referred to as "L (Lower) page", "U (Upper) page" and so forth.

<Data Write>

First, prior to the description given to data write of the present embodiment, the terms used below are described.

At the start, a series of processing executed at the time of data write is referred as a "write sequence". The write sequence is controlled by the sequence control circuit 7. The write sequence is executed through repetitions of a "write loop" including a "program operation" for actually changing the threshold voltage of a memory cell and a "verify operation" for verifying the threshold voltage of the memory cell. Each program operation has 1 or 2 or more "program steps". In each program step, a word line is at least once applied with a program voltage for changing the threshold voltage of a memory cell. Each verify operation has 1 or 2 or more "verify steps". In each verify step, a certain verify voltage is used to execute an operation for detecting the threshold voltage of a memory cell once.

Next, a write sequence of the present embodiment is described.

Figure 3:
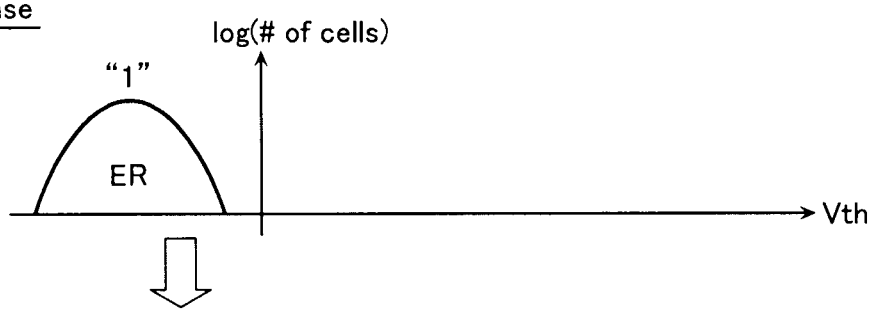
FIG. 3 is a diagram showing the states of transitions of threshold voltage distributions in a memory cell group at the time of a write sequence in the nonvolatile semiconductor memory device according to the same embodiment.
Figure 3:
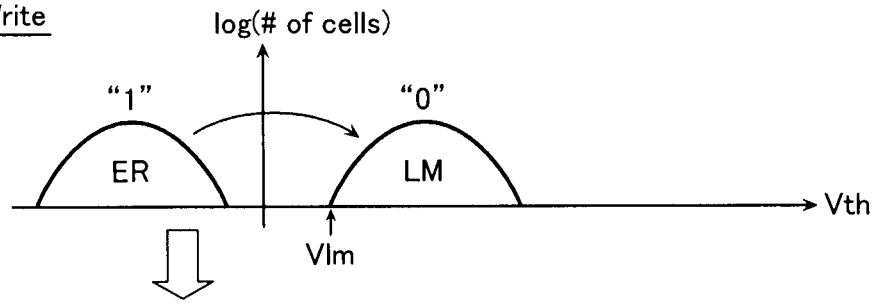
Figure 3:
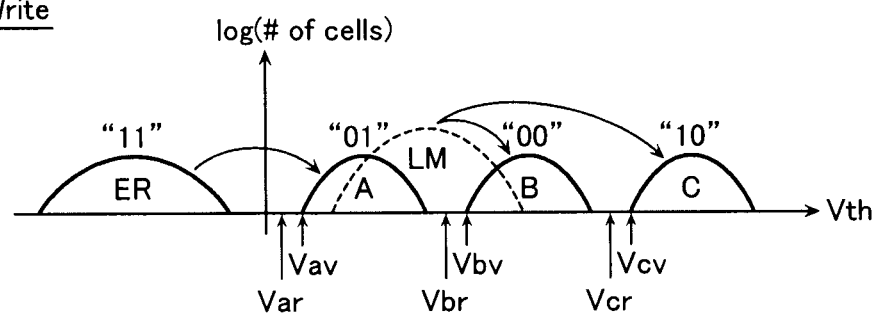

FIG. 3 is a diagram showing the states of transitions of threshold voltage distributions in a memory cell group at the time of a write sequence when 2-bit/cell type memory cells are used.

At the start, data erase is executed (step S101). This is executed over the whole block in batch. As a result, the threshold voltage distribution of all memory cells in the block is shifted to the lowermost ER level.

Subsequently, L page write is executed (step S102). This is executed on the basis of the lower bit of write data. If the lower bit is "1", the threshold voltage distribution of the memory cells is retained at ER level. If the lower bit is "0", the threshold voltage distribution of the memory cells changes from ER level to LM level, that is, a middle level between A level and B level, at which the lower limit of the threshold voltage distribution is higher than a voltage Vlm.

Finally, U page write is executed (step S103). This is executed on the basis of the upper bit of write data. If the threshold voltage distribution of the memory cells is at ER level, and if the upper bit is "1", the threshold voltage distribution of the memory cells is retained at ER level unchanged. In contrast, if the upper bit is "0", the threshold voltage distribution of the memory cells changes to A level higher than a voltage Vav (Vav<Vlm). On the other hand, if the threshold voltage distribution of the memory cells is at LM level, and if the upper bit is "0", the threshold voltage distribution of the memory cells changes to B level, at which the lower limit of the threshold voltage distribution is higher than a voltage Vbv (Vav<Vbv). In contrast, if the upper bit is "1", the threshold voltage distribution of the memory cells changes to C level, at which the lower limit of the threshold voltage distribution is higher than a voltage Vcv (Vbv<Vcv).

As described above, plural bits of data are assigned to respective threshold distributions of the memory cell MT. In addition, writing 2 bits of data to a memory cell is realized by L page write and U page write in 2 stages.

Writing in each page can be realized through repetitions of the following write loop.

The write loop includes a program operation for changing the threshold voltage Vth of the memory cell MC and a verify operation for verifying if the threshold voltage Vth of the memory cell MC is equal to or higher than a verify voltage. In a word, the verify operation is referred to as detecting if data is correctly written in the memory cell MC (the written state of data).

Figure 4:
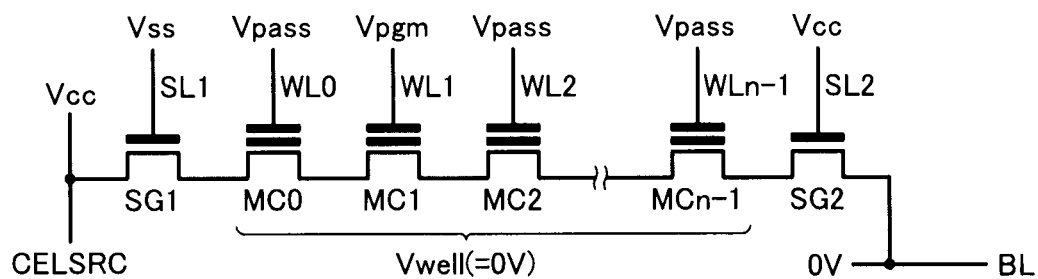
FIG. 4 is a diagram showing a bias state of the memory cell array at the time of a program operation in the nonvolatile semiconductor memory device according to the same embodiment.

The program operation in the write sequence can be realized by a bias state of the memory cell array 1 as shown in FIG. 4. The example shown in FIG. 4 shows a case of writing data in a memory cell MC1 connected to a word line WL1.

In a word, in the program operation, the control gate (word line WL1) of the selected memory cell MC1 is applied with a program voltage Vpgm (for example, around 20V) for a transition of the threshold voltage Vth of the memory cell MC while the control gates of other memory cells MC0, MC2, ..., MCn−1 are applied with a middle voltage Vpass (for example, around 10V). The middle voltage Vpass is almost such a voltage that the memory cells MC0, MC2, ..., MCn−1 turn on but are not programmed. The selection gate line SL1 close to the source line CELSRC is applied with the ground voltage Vss (for example, 0V) while the selection gate line SL2 close to the bit line BL is applied with the supply voltage Vcc. The bit line BL is applied with 0V. The source line CELSRC is applied with the supply voltage Vcc. The cell well is applied with a well voltage Vwell (for example, 0v).

Thus, the gate insulation film of the memory cell MC1 is applied with a high voltage so that electrons tunnel from the cell well into the charge accumulation layer to accumulate charge in the charge accumulation layer. As a result, the threshold voltage Vth of the memory cell MC1 shifts to the positive voltage side.

Figure 5:
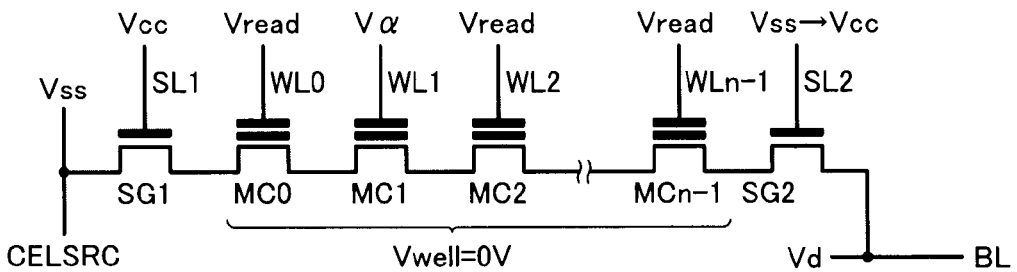
FIG. 5 is a diagram showing a bias state of the memory cell array at the time of a verify operation in the nonvolatile semiconductor memory device according to the same embodiment.

On the other hand, the verify operation in the write sequence is realized through the verify steps executed at every threshold voltage distribution. A bias state of the memory cell array 1 at the time of each verify step is as shown in FIG. 5. The example shown in FIG. 5 shows a case of determining the threshold voltage Vth of the memory cell MC1 connected to the word line WL1.

In the verify step, the control gate (word line WL0) of the selected memory cell MC1 is applied with a verify voltage Vα. The verify voltage Vα is a voltage corresponding to any of Vav, Vbv, Vcv shown in FIG. 3. The control gates of non-selected memory cells MC0, MC2, ..., MCn−1 are applied with a read voltage Vread (for example, 4V), the selection gate transistor SG1 with the supply voltage Vcc, and the selection gate transistor SG2 with the ground voltage Vss. The read voltage Vread is almost such a voltage that non-selected memory cells MC0, MC2, ..., MCn−1 turn on and that has a higher value than the upper limit of the uppermost threshold voltage distribution. This is used to turn on the non-selected memory cells MC0, MC2, ..., MCn−1. The bit line BL is precharged to a voltage Vd (for example, 1V). The source line CELSRC is applied with the ground voltage (for example, 0V). The cell well is applied with a well voltage Vwell (for example, 0V). After the bit line BL is precharged to the voltage Vd (for example, 1V), the selection gate transistor SG2 is applied with the supply voltage Vcc.

Thus, if the threshold voltage Vth of the memory cell MC1 is equal to or lower than the verify voltage Vα, the memory cell MC1 turns on so that the bit line BL is electrically connected to the source line CELSRC to lower the voltage on the bit line BL once precharged to the voltage Vd. Detecting the bit line BL at the sense amp S/A contained in the page buffer 3 makes it possible to determine if the threshold voltage Vth of the memory cell MC is equal to or lower than the verify voltage Vα.

The verify operation executes the herein-described verify steps 3 times in total on A level, B level, C level.

The write sequence repeats the write loop including the program operation and the verify operation described above while stepping-up the program voltage.

A read sequence is almost similar to the above-described verify operation. In the read sequence, the control gate (word line WL0) of the selected memory cell MC1 is applied with a reference voltage Vβ instead of the verify voltage Vα. The reference voltage Vβ includes 3 reference voltages Var, Vbr, Vcr in the case of the 2-bit/cell type memory cell MC. For example, the control gate of the selected memory cell MC1 is applied with the reference voltage Vbr. Subsequently, the control gate of the selected memory cell MC1 is applied with the reference voltage Var. If the threshold voltage Vth of the memory cell MC is lower than the reference voltage Vbr and higher than the reference voltage Var, the memory cell MC belongs to the threshold voltage distribution at A level.

For the purpose of understanding the present embodiment easier, the following description is given to the relation between the number of write/erase cycles and the number of write loops until verify-pass.

Figure 6:
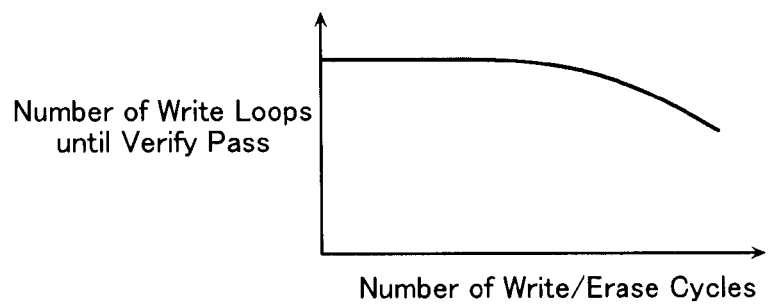
FIG. 6 is a diagram showing the relation between the number of write/erase cycles to a memory cell and the number of write loops until the memory cell verify-passes in the nonvolatile semiconductor memory device according to the same embodiment.

The write sequence executes the write loop repeatedly until verify-pass, as described above. The number of write loops until verify-pass tends to depend on the number of write/erase cycles. In general, as shown in FIG. 6, the more the number of write/erase cycles increases, the less the number of write loops executed until verify-pass becomes.

This is because repeating write/erase to the memory cell deteriorates the tunnel insulation film and increases electron traps such that the threshold voltage Vth of the memory cell MC is observed apparently higher. As a result, just applying a relatively low program voltage Vpgm causes the threshold voltage Vth of the memory cell MC to exceed a desired verify voltage Vα. In a word, when the number of write/erase cycles increases, the threshold voltage Vth of the memory cell MC easily makes a transition (hereinafter, the easiness of the transition of the threshold voltage of a memory cell is referred to as a "program speed").

On the other hand, when the write/erase cycles to the memory cell MC increase, the resultant stress deteriorates the charge retention characteristic of the memory cell (hereinafter referred to as a "retention characteristic").

In summary, as for a memory cell having a large number of write/erase cycles (hereinafter referred to as a "cycled cell". The cycled cell includes a memory cell having almost the same characteristic as that of the cycled cell independent of the number of write/erase cycles.), the program speed is faster and the retention characteristic is worse. In other words, as for a memory cell having a small number of write/erase cycles (hereinafter referred to as a "fresh cell". The fresh cell includes a memory cell having almost the same characteristic as that of the fresh cell independent of the number of write/erase cycles.), the program speed is slower and the retention characteristic is better.

The memory cells are written by a page unit. Therefore, some page unit having a high proportion of cycled cells (hereinafter referred to as a "cycled page") and another page unit having a high proportion of fresh cells (hereinafter referred to as a "fresh page") may be mixed. The present embodiment requires no modification of the write condition for each page even if the cycled page and the fresh page are mixed in this way. For example, it is not required to modify the program voltage between the cycled page and the fresh page. As a result, the control can be simplified.

Herein considered as a method of ensuring the retention characteristic of the cycled cell is to set the verify voltage slightly higher in the program stage. In this case, the margin of the reference voltage is made larger. Therefore, even if the threshold voltage lowers due to long time leaving and so forth, correct data can be read out.

In the case of this method, however, it is made increasingly difficult to program fresh cells having a slower program speed. In the worst case, a write failure may occur. In particular, in the stage of a product test that treats fresh cells only, a memory cell originally treatable as a good product is determined write-failed. This causes an undesired reduction in yield.

Therefore, in the first embodiment, the increase in the number of write/erase cycles is determined from the number of program times in a pseudo manner. In addition, the verify-pass condition is made stricter to suppress write failures in the fresh cells without losing the retention characteristic of the cycled cell.

Specifically, a write sequence as follows is executed.

Figure 7:
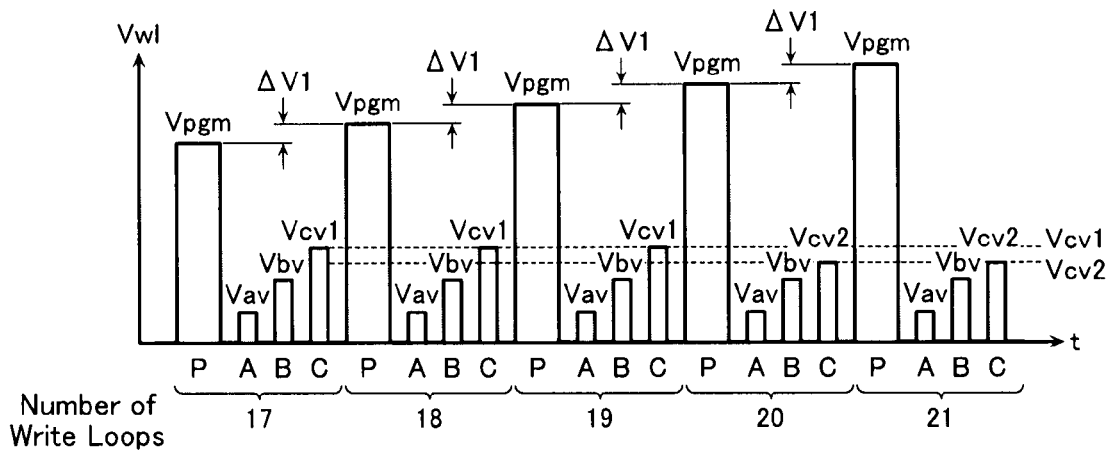
FIG. 7 is a diagram showing voltage waveforms on a word line at the time of a write sequence in the nonvolatile semiconductor memory device according to the same embodiment.
Figure 8:
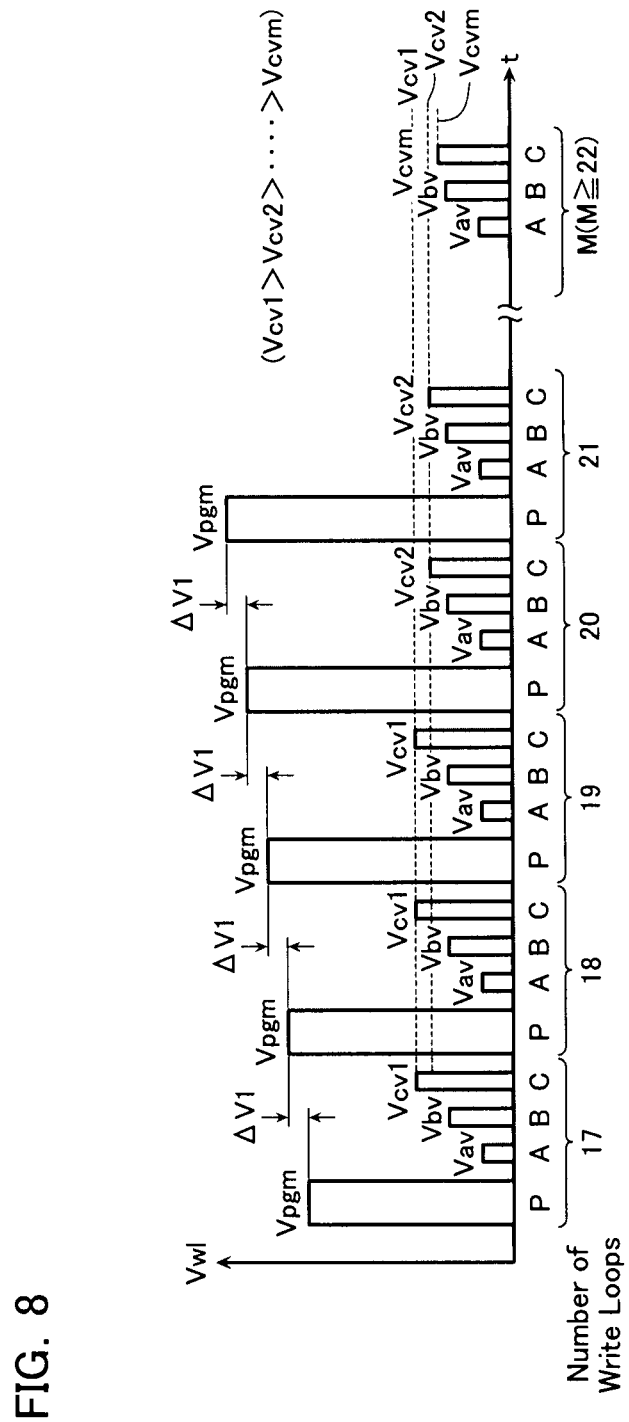
FIG. 8 is a diagram showing voltage waveforms on the word line at the time of the write sequence in the nonvolatile semiconductor memory device according to the same embodiment.

FIG. 7 is a diagram showing voltage waveforms on a word line WL at the time of the write sequence of the present embodiment. In the figure, "P" indicates a program step in the program operation, "A" a verify step for A level in the verify operation, "B" a verify step for B level in the verify operation, and "C" a verify step for C level in the verify operation.

Figure 9:
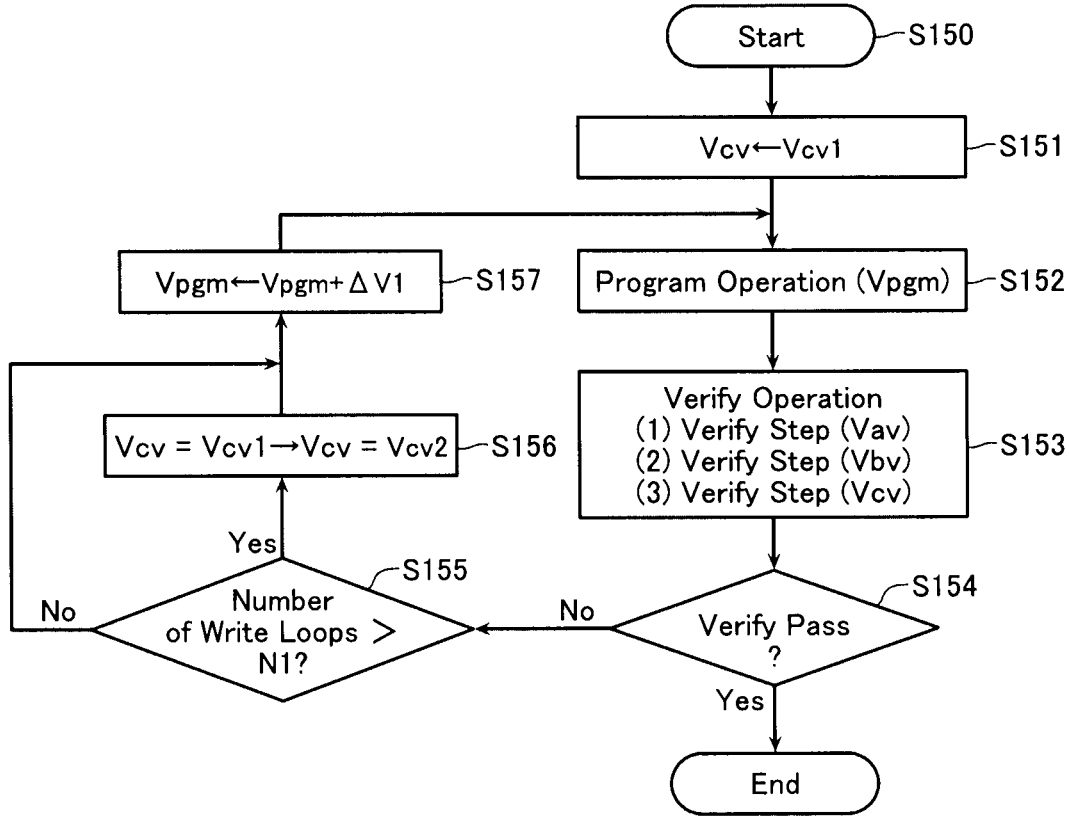
FIG. 9 is a flowchart of the write sequence in the nonvolatile semiconductor memory device according to the same embodiment.

FIG. 9 is a flowchart of the write sequence in the same embodiment.

At the start, the controller 11 sends a write command to the logic control circuit 6. The logic control circuit 6 controls the sequence control circuit 7 so that it executes the write sequence (step S150). The sequence control circuit 7 applies Vcv1 (first verify voltage) to initialize the verify voltage Vcv used in the verify step for C level (step S151), and then executes a program operation using the program voltage Vpgm (step S152).

Subsequently, the sequence control circuit 7 executes a verify step for A level using the verify voltage Vav, a verify step for B level using the verify voltage Vbv, and a verify step for C level using the verify voltage Vcv (step S153). At this stage, if the verify steps for all levels (the verify operation) can pass (Yes at step S154), the write sequence finishes. The "verify operation pass" contains a verify operation determined in consideration of "the number of neglected bits" described later. On the other hand, if the verify operation failed to pass (No at step S154), the sequence control circuit 7 shifts processing to step S155.

Subsequently, it determines if the number of write loops is higher than N1 times (step S155). In the example of FIG. 7, the number of times N1 is 19. The number of times N1 may be stored in the ROM fuse area 1a or may be sent together with the write command from the controller 11. If the number of write loops is higher than N1 times (Yes at step S156), the sequence control circuit 7 modifies the verify voltage Vcv to Vcv2 (second verify voltage) from Vcv1 (step S156). On the other hand, if the number of write loops is equal to or lower than N1 times (No at step S155), the sequence control circuit 7 shifts processing to step S157 without modifying the verify voltage Vcv1.

Subsequently, the sequence control circuit 7 steps up the program voltage Vpgm by ΔV1 (step S157). Then, the sequence control circuit 7 returns processing to step S152 again, and repeatedly executes the write loop.

In a word, in the case of FIG. 7, in write loops from the 1st through the 19th, it executes (1) a program operation using the program voltage Vpgm, (2) a verify step for A level using the verify voltage Vav, (3) a verify step for B level using the verify voltage Vbv, and (4) a verify step for C level using a verify voltage Vcv1. In write loops from the 20th up, different from the write loops up to the 19th, it uses a verify voltage Vcv2 lower than the verify voltage Vcv1 at the verify step for C level. In the example shown in FIG. 7, the program voltage Vpgm is stepped up at equal intervals by a voltage ΔV1 at every write loop.

Figure 10:
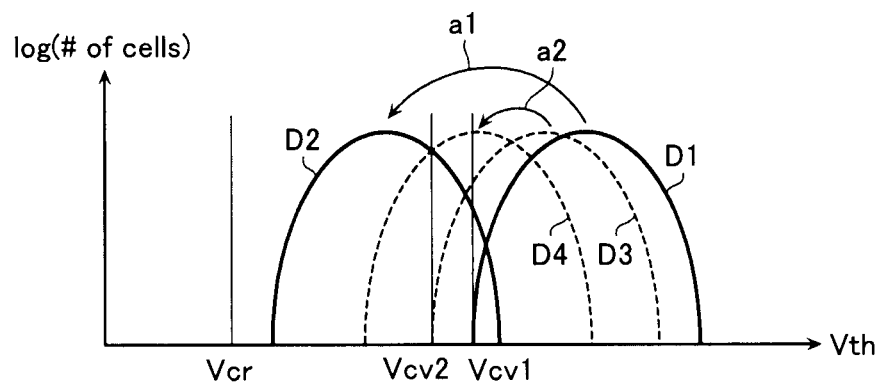
FIG. 10 is a diagram showing the state of the reduction in the threshold voltage distribution after long time leaving the memory cell in the nonvolatile semiconductor memory device according to the same embodiment.

FIG. 10 is a diagram showing threshold voltage distributions at level C in the execution of the write sequence described using FIGS. 7 and 9. The solid line shows a threshold voltage distribution in a memory cell group (hereinafter referred to as a "first memory cell group") for which programming completes in the write loops up to the 19th. The dashed-line shows a threshold voltage distribution in a memory cell group (hereinafter referred to as a "second memory cell group") for which programming completes in the write loops from the 20th up. Hereinafter, a memory cell contained in the first memory cell group may also be referred to as a "first memory cell" and a memory cell contained in the second memory cell group as a "second memory cell".

In the case of the first memory cell group, the lower limit of the threshold voltage distribution immediately after the execution of the write sequence becomes equal to or higher than the verify voltage Vcv1 as shown with D1 in the figure. The first memory cell group is faster in program speed than the second memory cell group. Accordingly, it includes cycled cells having a worse retention characteristic as can be considered. In this case, as shown with a1 in the figure, the threshold voltage of the memory cell has a large reduction due to high temperature leaving and so forth as can be considered. There is a sufficient margin, however, between the verify voltage Vcv1 and the reference voltage Vcr. Accordingly, even if the threshold voltage Vth of the memory cell MC lowers, it is possible to ensure a threshold voltage distribution D2 equal to or higher than the reference voltage Vcr.

On the other hand, in the case of the second memory cell group, the lower limit of the threshold voltage distribution immediately after the execution of the write sequence is only equal to or higher than the verify voltage Vcv2 (Vcv2<Vcv1) as shown with D3 in the figure. The second memory cell group, however, is slower in program speed than the first memory cell group. Accordingly, it includes fresh cells having a better retention characteristic as can be considered. Therefore, as shown with a2 in the figure, the threshold voltage distribution of the memory cell has a small reduction due to long time leaving and so forth as can be considered. Accordingly, even if the threshold voltage Vth of the memory cell MC lowers, it is possible to ensure a threshold voltage distribution equal to or higher than the reference voltage Vcr.

Thus, in the present embodiment, the number of write loops is used to select the verify voltage. As a result, with respect to the cycled cells, it is possible to sufficiently ensure a margin of retention characteristic, that is, the difference between the verify voltage Vcv1 and the reference voltage Vcr. On the other hand, with respect to the fresh cells, it is possible to relieve the verify pass condition to suppress the occurrence of write failures. Even in this case, it is possible to ensure the retention characteristic.

Here, C level is the voltage threshold distribution at the highest level and accordingly it is programming-hard. In addition, it has a large amount of charge held in the charge accumulation layer and accordingly enough of the retention characteristic. On the other hand, at A level and B level, the voltage threshold distribution is lower, and a high retention characteristic is not required. Namely, if only the verify voltage at C level can be lowered at least, it is possible to hold the retention characteristic and suppress the occurrence of write failures. As a result, the verify voltage at A level and B level is not modified and accordingly the circuit operation can be made easier.

In the example shown in FIGS. 7-10, for the purpose of suppressing the occurrence of write failures at the most programming-hard, highest level, that is, C level, only the verify voltage at C level is lowered in accordance with the number of write loops though the verify voltages at A level and B level may be lowered. The reference voltage Vcr and the verify voltages Vcv1, Vcv2 can be set arbitrarily in accordance with the specification such as the leaving state and the leaving time. Further, switching among the verify voltages in 3 or more stages (FIG. 8), and setting the number of switching times may be made freely.

Thus, the present embodiment makes it possible to provide a nonvolatile semiconductor memory device capable of suppressing the occurrences of write failures while holding the retention characteristic.

In addition, the present embodiment makes it possible to reduce the stress of the memory cell MC because it modifies no program voltage.

Even if cycled cells and fresh cells having the same number of write/erase cycles are mixed in the memory cell array, the present embodiment is possible to use the number of write loops as the reference to distinguish cycled cells and fresh cells appropriately. Accordingly, it can exert the Second Embodiment In the first embodiment, the step-up width of the program voltage Vpgm is constant. In contrast, in a second embodiment, the step-up width of the program voltage Vpgm is modified based on the number of write loops.

Figure 11:
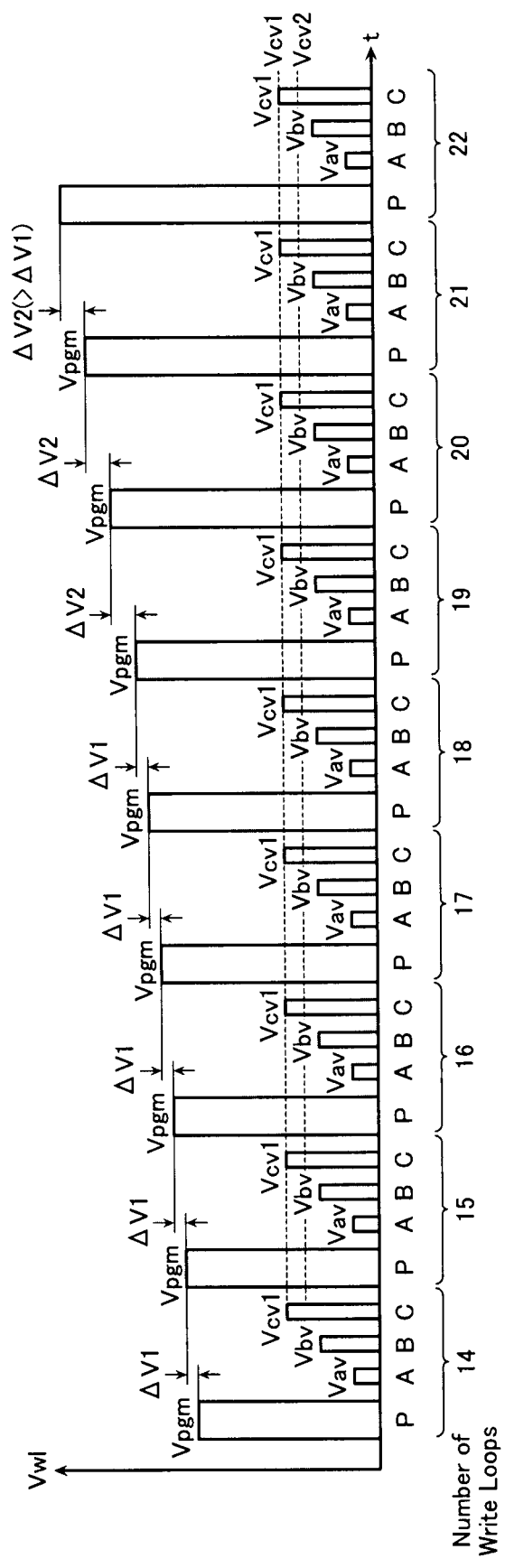
FIG. 11 is a diagram showing voltage waveforms on a word line at the time of a write sequence in a nonvolatile semiconductor memory device according to a second embodiment.
Figure 12:
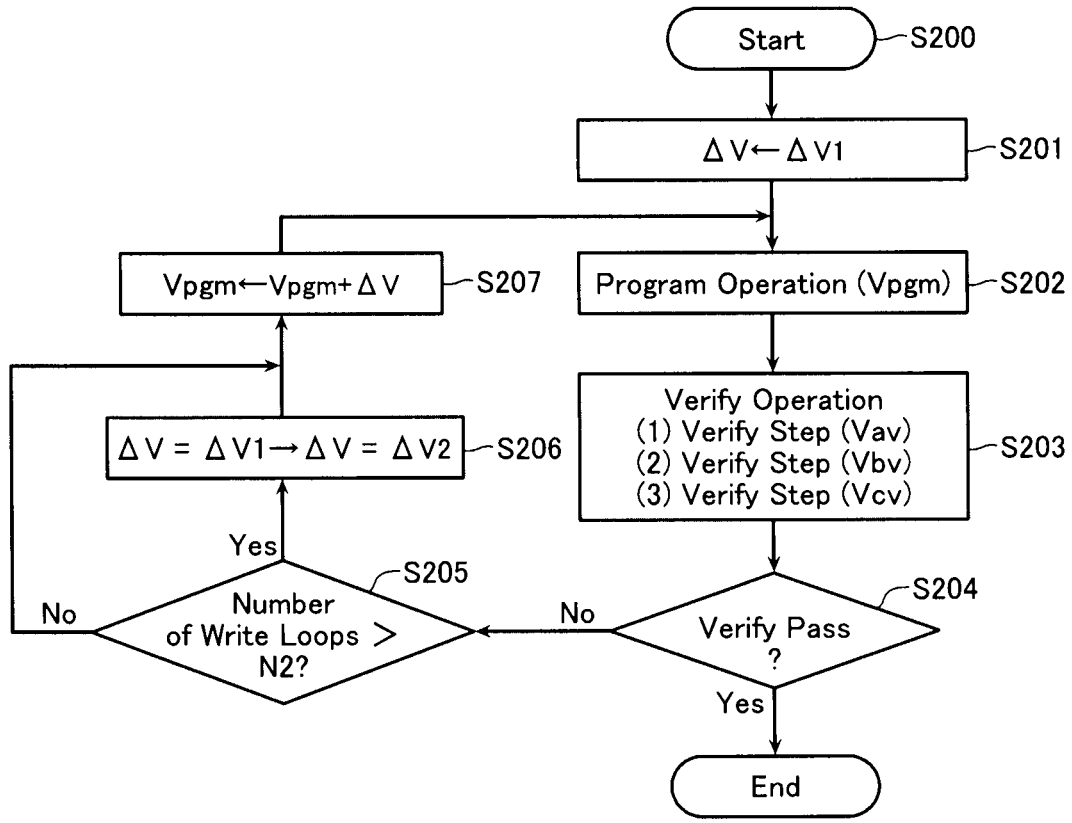
FIG. 12 is a flowchart of the write sequence in the nonvolatile semiconductor memory device according to the same embodiment.

FIG. 11 is a diagram showing a voltage Vw1 applied to the selected word line at the time of a write sequence in the second embodiment. FIG. 12 is a flowchart of the write sequence in the present embodiment.

At the start, the controller 11 sends a write command to the logic control circuit 6. The logic control circuit 6 controls the sequence control circuit 7 so that it executes the write sequence (step S200). The sequence control circuit 7 applies ΔV1 to initialize the step-up width ΔV of the program voltage Vpgm (step S201), and then executes a program operation using the program voltage Vpgm (step S202).

As for subsequent steps S203 and S204, they are similar to the steps S153 and S154 in FIG. 9 and accordingly omitted from the following description. Though, the verify voltage for C level is constant at Vbv1.

Subsequently, it determines if the number of write loops is higher than N2 times (step S205). In the example of FIG. 11, the number of times N2 is equal to 19. The number of times N2 may be stored in the ROM fuse area 1a or may be sent together with the write command from the controller 11. If the number of write loops is higher than N2 times (Yes at step S205), the sequence control circuit 7 modifies the step-up width ΔV of the program voltage Vpgm from ΔV1 to ΔV2 (step S206). On the other hand, if the number of write loops is equal to or lower than N2 times (No at step S205), the sequence control circuit 7 shifts processing to step S207 without modifying the step-up width ΔV of the program voltage Vpgm.

Subsequently, the sequence control circuit 7 steps up the program voltage Vpgm by ΔV (step S207). Then, the sequence control circuit 7 returns processing to step S202 again, and repeatedly executes the write loop.

Thus, in the case of the present embodiment, in the write loops up to the N2-th (the 19th in the case of FIG. 11), the step width of the program voltage Vpgm is ΔV1. In contrast, in the write loops from the (N2+1)-th (the 20th in the case of FIG. 11) up, the step width of the program voltage Vpgm is ΔV2 larger than ΔV1.

In a word, with respect to the first memory cell for which programming completes in the write loops up to the N2-th, that is, with respect to the cycled cell having a worse retention characteristic, it is subject to precise programming with the step width of the program voltage Vpgm reduced to small ΔV1, thereby narrowing the threshold voltage distribution of the memory cell. As a result, it is possible to take a large leaving margin.

On the other hand, with respect to the second memory cell for which programming completes in the write loops from the (N2+1)-th up, that is, with respect to the fresh memory cell having a slower program speed, enlarging the step width of the program voltage Vpgm to ΔV2 makes it possible to suppress the number of repeated write loops.

Figure 13:
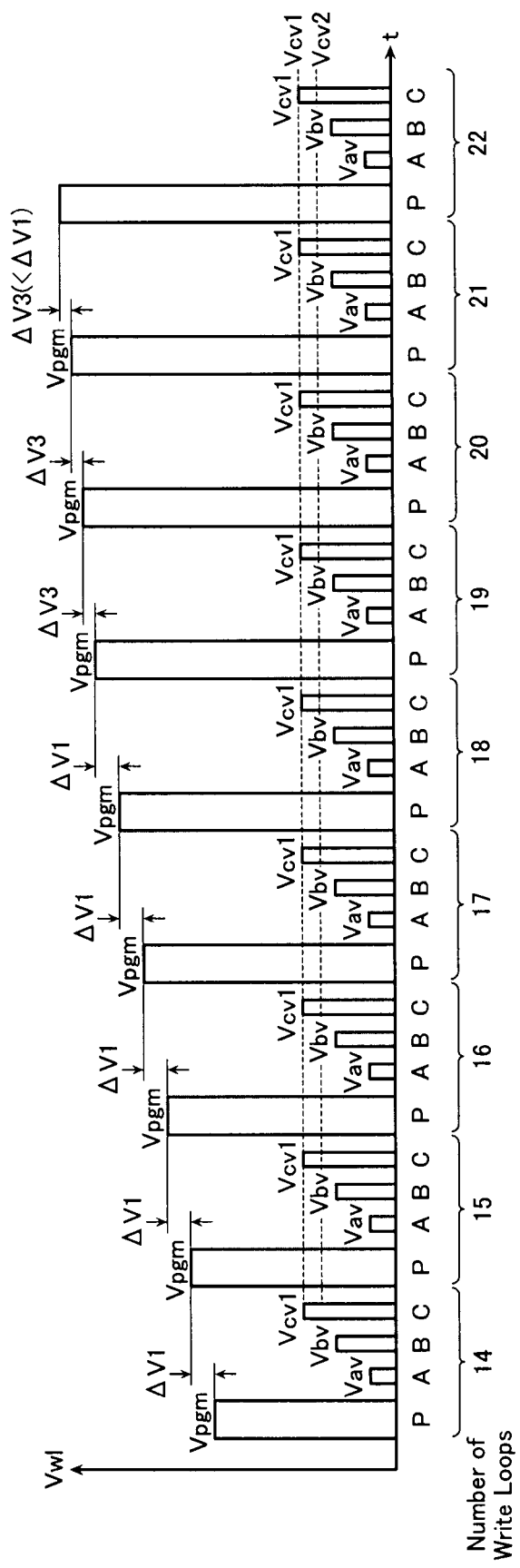
FIG. 13 is a diagram showing voltage waveforms on a word line at the time of the write sequence in the nonvolatile semiconductor memory device according to the same embodiment.

Depending on the specification of the product, as in the example shown in FIG. 13, in the write loops up to the 19th, the step width of the program voltage Vpgm may be set to ΔV1. In the write loops from the 20th up, the step width of the program voltage Vpgm may be set to ΔV3 smaller than ΔV1.

Figure 14:
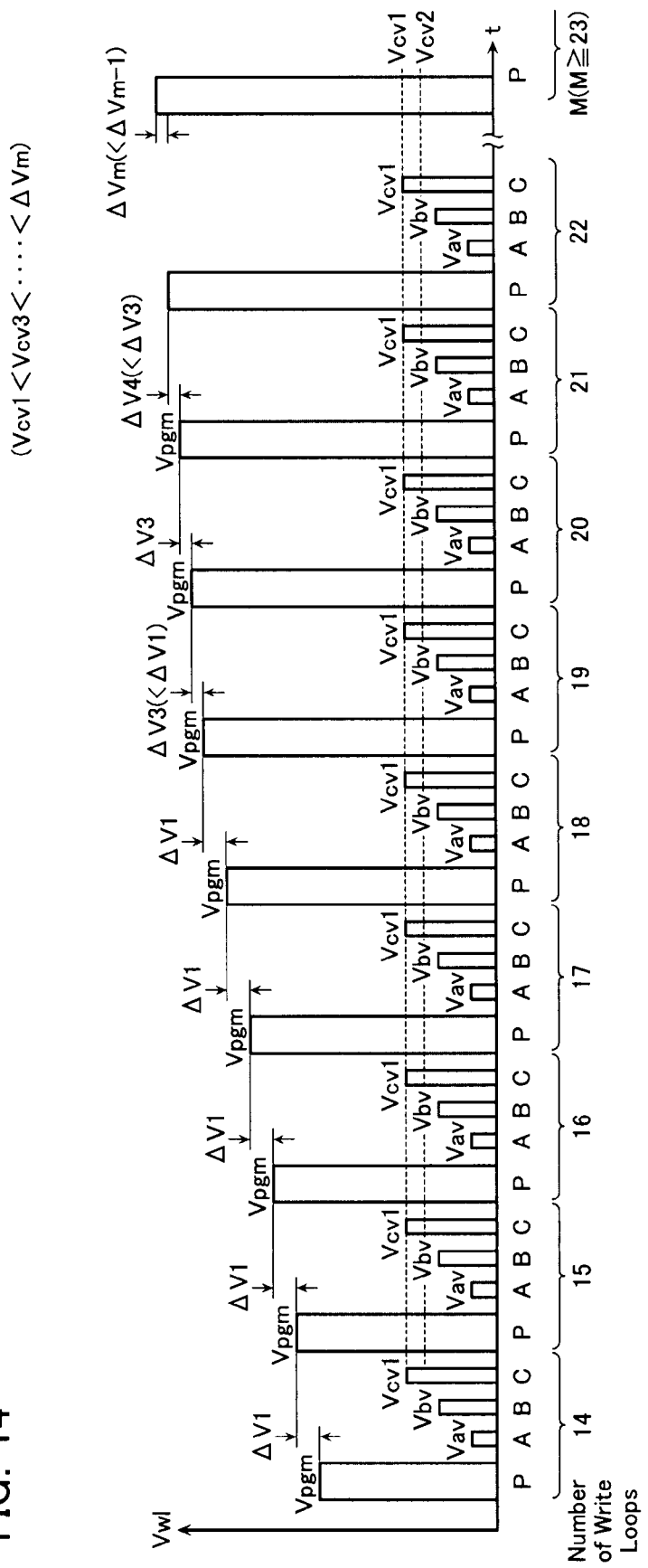
FIG. 14 is a diagram showing voltage waveforms on the word line at the time of the write sequence in the nonvolatile semiconductor memory device according to the same embodiment.

In the example shown in FIGS. 11 and 13, the step width of the program voltage Vpgm is switched when the number of write loops reaches 20 times though the number of write loops for switching is arbitrary. Further, in the case of the present embodiment, the step width of the program voltage Vpgm may be switched in 3 stages or more (FIG. 14).

Thus, similar to the first embodiment, the present embodiment makes it possible to provide a nonvolatile semiconductor memory device capable of improving the retention characteristic and suppressing the occurrences of write failures. In addition, the present embodiment makes it possible to enlarge the leaving margin of the refresh cell.

Further, the present embodiment may be used in combination with the modification of the verify voltage in the first embodiment. In this case, the step width of the program voltage Vpgm increases though the verify voltage Vcv lowers. Accordingly, it is possible to prevent the upper hem of the threshold voltage distribution from extending.

Third Embodiment

As for the nonvolatile semiconductor memory device, on the grounds of fine fabrications and so forth, it becomes difficult to program all memory cells reliably. Therefore, on the premise of error correction by an ECC system, it tolerates write errors up to a point.

As an example, in a nonvolatile semiconductor memory device capable of tolerating write errors up to 8 bits per page, a case is considered here on shifting the threshold voltage Vth of the memory cell MC at ER level to the uppermost level, that is, C level. Hereinafter, the number of write-error-tolerable bits is referred to as "the number of neglected bits".

Figure 15:
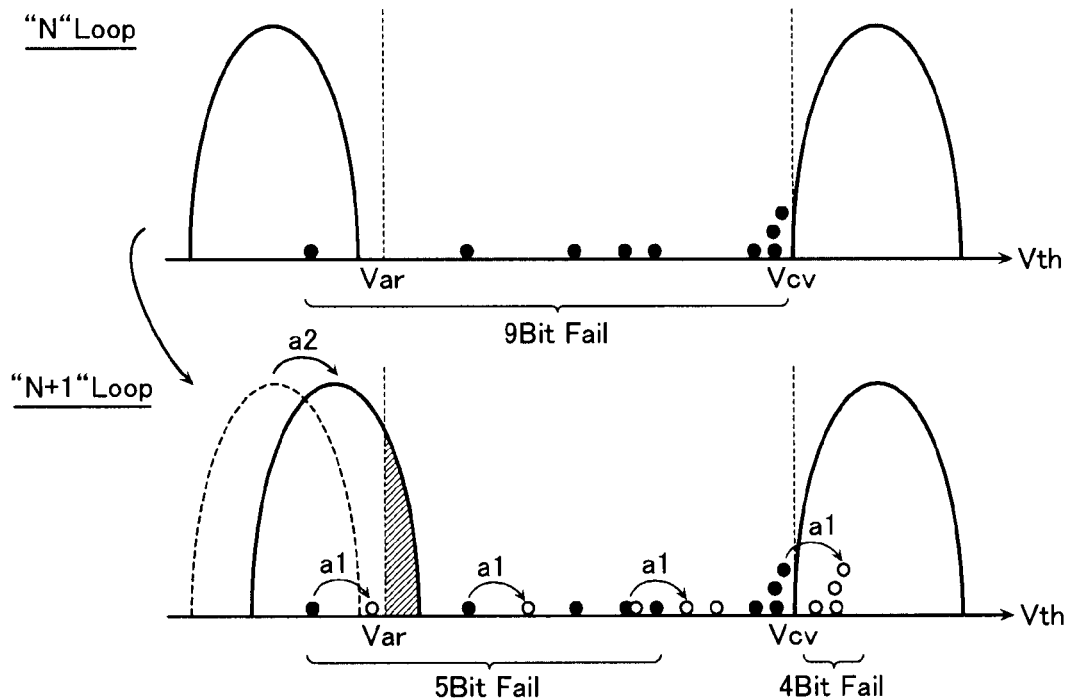
FIG. 15 is a diagram illustrative of the principle of a write sequence in a nonvolatile semiconductor memory device according to a third embodiment.

As a result of shifting the memory cell at ER level to C level, the threshold voltage distribution after the execution of the N-th write loop may become as shown in FIG. 15. In this case, the memory cells MC at the verify voltage Vcv or lower are 9 cells (9 bits). Therefore, the write loop is executed successively.

Thereafter, as shown in the lower part of FIG. 15, however, when the (N+1)-th write loop is executed, part of the memory cells MC having the threshold voltage Vth equal to or lower than the verify voltage Vcv may exceed the verify voltage Vcv as shown with a1 in the figure. As a result, the number of write errors becomes 5 bits lower than 8 bits. However, the threshold voltage distribution in the memory cell group once located at ER level is also shifted in the positive voltage direction by program disturb as shown with a2 in the figure. Thus, part of the threshold voltage distribution at ER level exceeds the verify voltage Var for A level and varies to the data at A level.

Therefore, the third embodiment modifies the number of neglected bits in accordance with the number of write loops, thereby suppressing the occurrence of program disturb.

Figure 16:
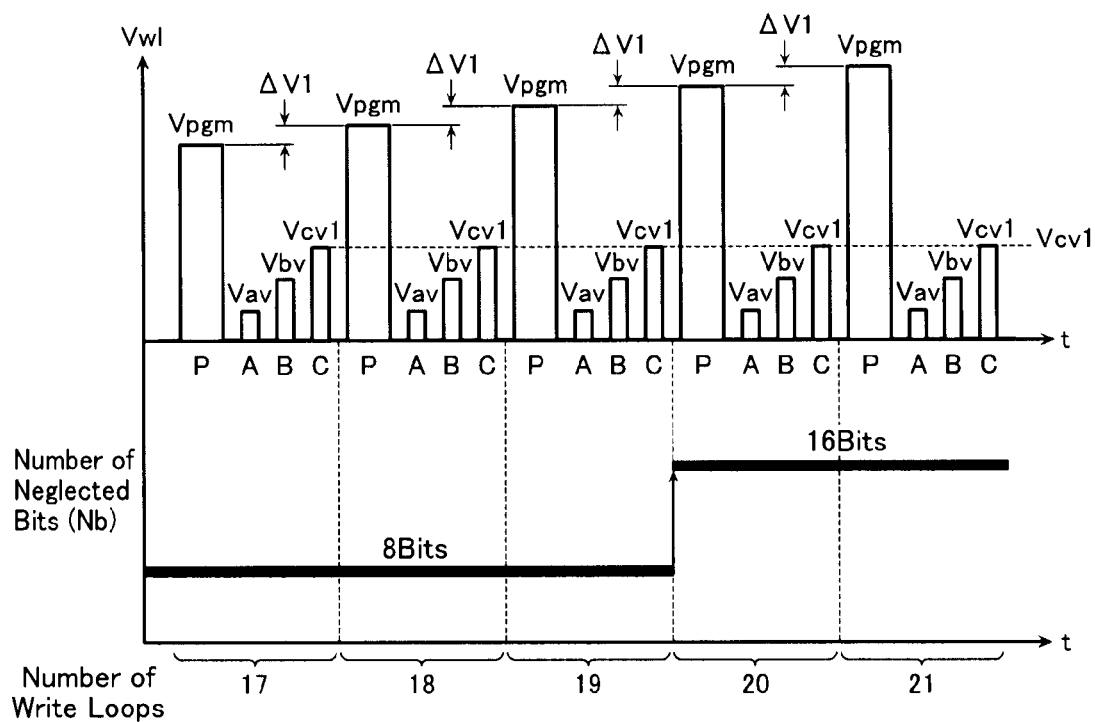
FIG. 16 is a diagram showing the relation between the number of write loops and the number of neglected bits at the time of the write sequence in the nonvolatile semiconductor memory device according to the same embodiment.
Figure 17:
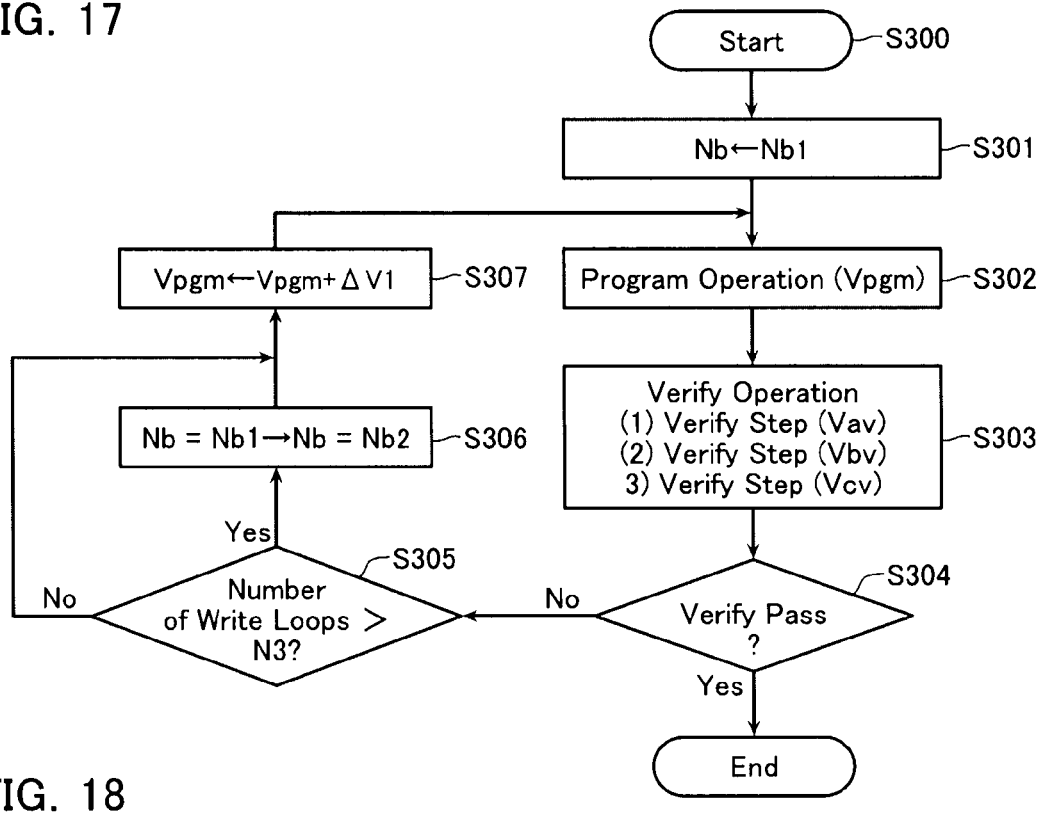
FIG. 17 is a flowchart of the write sequence in the nonvolatile semiconductor memory device according to the same embodiment.

FIG. 16 is a diagram showing the relation between the number of write loops and the number of neglected bits at the time of the write sequence in the present embodiment. FIG. 16 is a diagram when the number of neglected bits has the maximum value of 16 bits. FIG. 17 is a flowchart of the write sequence in the present embodiment.

At the start, the controller 11 sends a command to the logic control circuit 6. The logic control circuit 6 controls the sequence control circuit 7 so that it executes the write sequence (step S300). The sequence control circuit 7 applies Nb1 (first number of pieces) to initialize the number of neglected bits Nb (step S301), and then executes the program operation using the program voltage Vpgm (step S302).

As for subsequent steps S303 and S304, they are similar to the steps S153 and S154 in FIG. 9 and accordingly omitted from the following description. Though, the verify voltage for C level is constant at Vbc1.

Subsequently, it determines if the number of write loops is higher than N3 (step S305). In the example of FIG. 16, the number of times N3 is 19. The number of times N3 may be stored in the ROM fuse area 1a or may be sent together with the write command from the controller 11. If the number of write loops is higher than N3 (Yes at step S305), the sequence control circuit 7 modifies the number of neglected bits Nb to Nb2 (second number of pieces) from Nb1 (step S306). On the other hand, if the number of write loops is equal to or lower than N3 (No at step S306), the sequence control circuit 7 shifts processing to step S307 without modifying the number of neglected bits Nb.

Subsequently, the sequence control circuit 7 steps up the program voltage Vpgm by ΔV1 (step S307). Then, the sequence control circuit 7 returns processing to step S302 again, and repeatedly executes the write loop.

Thus, in the write loops up to the N3-th (the 19th in the case of FIG. 16), the verify operation is executed with the number of neglected bits modified to 8 bits. In the write loops from the (N3+1)-th (the 20th in the case of FIG. 16) up, the verify operation is executed with the number of neglected bits modified to 16 bits.

In a word, with respect to the first memory cells regarded as the cycled cells, the number of neglected bits at the time of the verify operation is limited. In this case, even if the threshold voltages Vth of the memory cells MC lower due to long time leaving such that the threshold voltage Vth of part of the memory cells MC becomes equal to or lower than the verify voltage Vcv, the ECC system can correct errors if they are up to 8 bits at the maximum.

On the other hand, with respect to the second memory cell group regarded as the fresh cells, the number of neglected bits is increased to 16 bits, thereby suppressing the increase in the number of write loops. In accordance therewith, it is possible to prevent the program disturb from occurring.

Thus, similar to the first embodiment, in accordance with the present embodiment, it is possible to keep the retention characteristic and suppress the occurrences of write failures. In addition, in the case of the present embodiment, it is possible to prevent the program disturb from occurring due to the increase in the number of write loops.

In the write loops from the (N3+1)-th up, the number of neglected errors Nb is increased though it is not for ECC enhancement. Accordingly, the time for computing parity bits does not extend.

Even if the number of neglected bits is fixed, the same effect can be exerted even when the verify voltage is changed, similar to the first embodiment.

Figure 18:
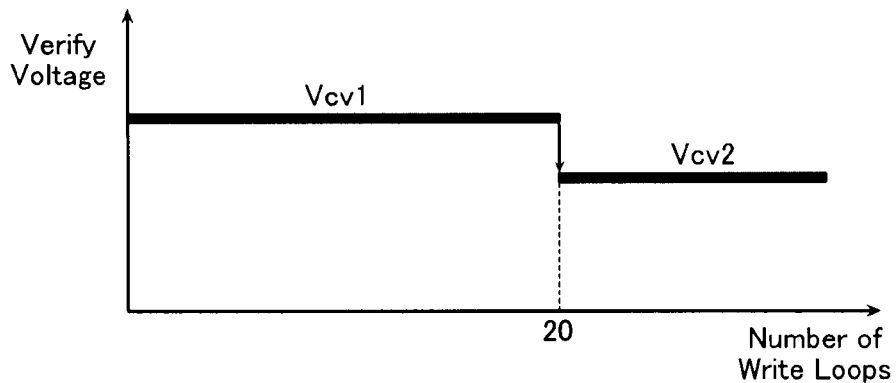
FIG. 18 is a diagram showing the relation between the number of write loops and the verify voltage at the time of the write sequence in the nonvolatile semiconductor memory device according to the same embodiment.
Figure 19:
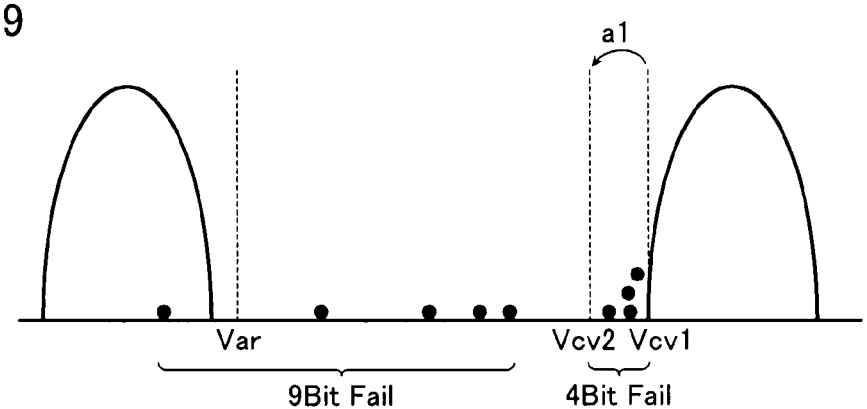
FIG. 19 is a diagram illustrative of the effect of the write sequence in the nonvolatile semiconductor memory device according to the same embodiment.

In a word, as shown in FIG. 18, for example, in the write loops up to the 19th, the verify voltage Vcv1 is used to execute the verify step. In the write loops from the 20th up, as shown with a1 in the figure, the verify voltage is lowered from Vcv1 to Vcv2 to execute the verify step. Thus, by switching the verify voltage, as shown in FIG. 19, for example, 9 bit errors caused when the verify voltage Vcv1 is used to execute the verify step can be reduced to 5 bit errors when the verify voltage Vcv2 is used to execute the verify step. In a word, it results in a reduction in the number of neglected errors substantially and accordingly can exert the same effect as that in the case shown in FIG. 13.

Figure 20:
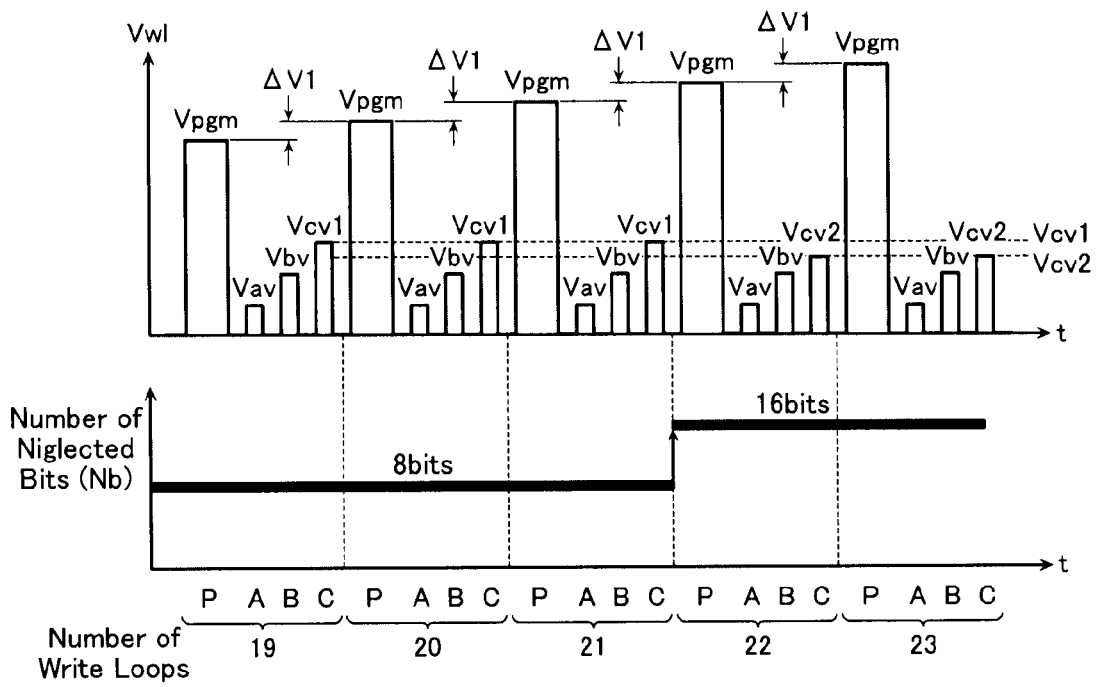
FIG. 20 is a diagram showing the relation between the number of write loops and the number of neglected bits at the time of the write sequence in the nonvolatile semiconductor memory device according to the same embodiment.

Further, it may be used in combination with the modification of the verify voltage in the first and second embodiments. For example, the number of neglected bits is increased in the write loops from the 20th up and the verify voltage Vcv is lowered in the write loops from the 23rd up (FIG. 20). In this case, it is possible to apply the program voltage to the memory cells close to the relieved number of neglected bits. As a result, it is possible to exert the effect more greatly on the possibility of keeping the retention characteristic and suppressing the occurrence of write failures.

On the other hand, the verify voltage Vcv may be lowered in the write loops from the 20th up and the number of neglected bits may be increased in the write loops from the 23rd up. In this case, it is possible to execute writing faster.

Fourth Embodiment

A fourth embodiment describes a nonvolatile semiconductor memory device, which changes the sense time at the time of the verify step in accordance with the number of write loops. The sense time means time form discharge of the bit line BL voltage to detect of the bit line BL voltage.

Figure 21:
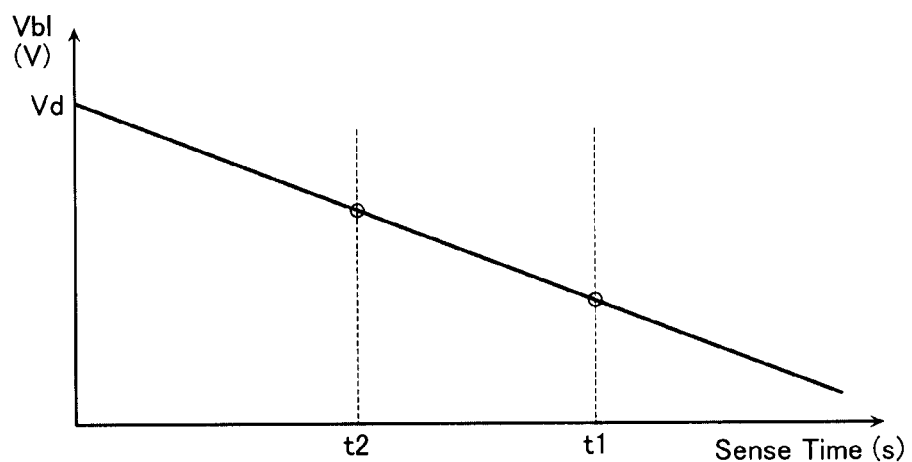
FIG. 21 is a diagram showing the relation between the sense time and the bit line voltage at the time of a verify operation in a nonvolatile semiconductor memory device according to a fourth embodiment.
Figure 22:
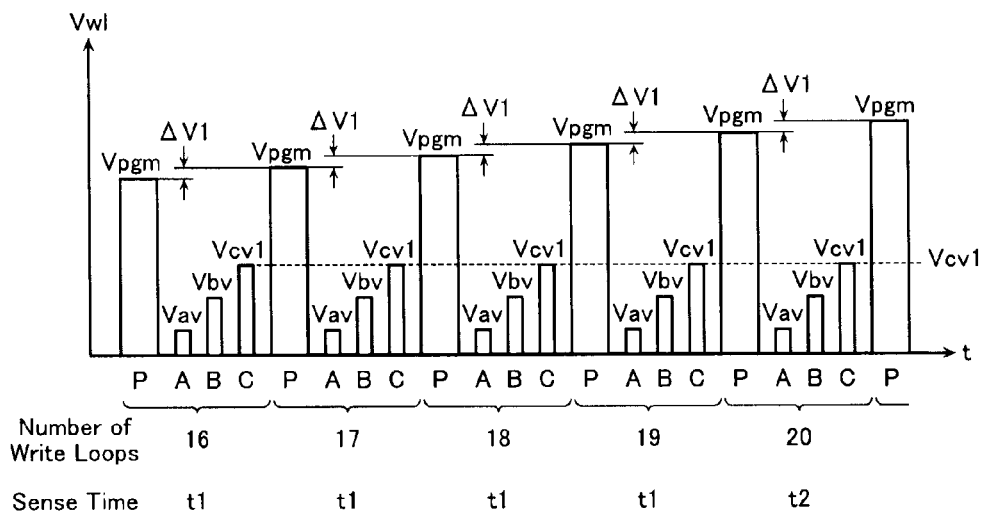
FIG. 22 is a diagram showing the relation between the number of write loops and the sense time at the time of the write sequence in the nonvolatile semiconductor memory device according to the same embodiment.
Figure 23:
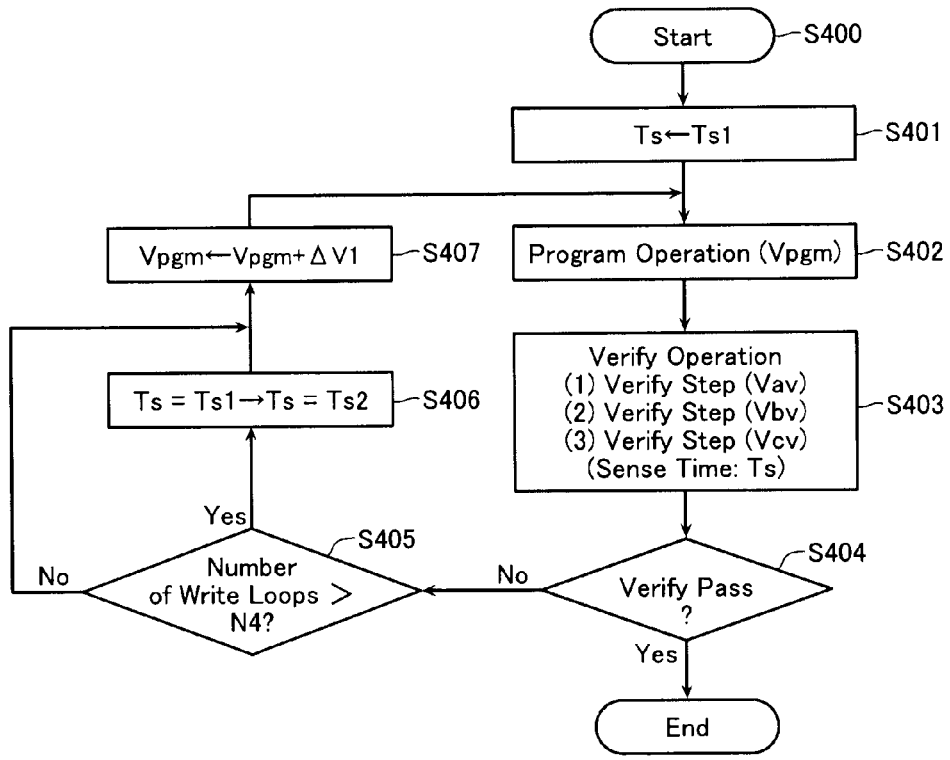
FIG. 23 is a flowchart of the verify operation in the nonvolatile semiconductor memory device according to the same embodiment.

FIG. 21 is a diagram showing the relation between the sense time and the bit line voltage Vb1 at the time of the verify step according to the present embodiment. FIG. 22 is showing a voltage Vw1 applied to the selected word line and the sense time at the time of a write sequence in the present embodiment. FIG. 23 is a flowchart of the write sequence in the present embodiment.

At the start, the controller 11 sends a write command to the logic control circuit 6. The logic control circuit 6 controls the sequence control circuit 7 so that it executes the write sequence (step S400). The sequence control circuit 7 applies Ts1 (first sense time) to initialize the sense time Ts (step S401), and then executes a program operation using the program voltage Vpgm (step S402).

As for subsequent steps S403 and S404, they are similar to the steps S153 and S154 in FIG. 9 and accordingly omitted from the following description. Though, the verify voltage for C level is constant at Vbc1.

Subsequently, it determines if the number of write loops is higher than N4 (step S405). The number of times N4 may be stored in the ROM fuse area 1a or may be sent together with the write command from the controller 11. In the example of FIG. 7, the number of times N4 is 19. If the number of write loops is higher than N4 (Yes at step S405), the sequence control circuit 7 modifies the sense time Ts to Ts2 (second sense time) from Ts1 (step S406). On the other hand, if the number of write loops is equal to or lower than N4 (No at step S406), the sequence control circuit 7 shifts processing to step S407 without modifying the sense time Ts.

Subsequently, the sequence control circuit 7 steps up the program voltage Vpgm by $\Delta V1$ (step S407). Then, the sequence control circuit 7 returns processing to step S402 again, and repeatedly executes the write loop.

As above, in the write loops up to the N4-th, the sense time at the verify step is modified to t1. In the write loops from the (N4+1)-th up, the sense time at the verify step is modified to t2 shorter than t1.

In a word, in the case of the first memory cell group regarded as the cycled cells, the sense time t1 after the sense time t2 is used to sense the bit line BL voltage, thereby detecting the threshold voltage of the memory cell closer to the actual value.

On the other hand, in the case of the second memory cells regarded as the fresh cells, the sense time is as short as t2. Therefore, the voltage on the bit line BL cannot lower sufficiently. As a result, the threshold voltage Vth of the memory cell MC is observed slightly higher, making verify-pass easier. Therefore, it is possible to suppress the increase in the number of write loops to the fresh cells.

Thus, the present embodiment makes it possible to provide a nonvolatile semiconductor memory device capable of suppressing the occurrences of write failures without losing the retention characteristic. In addition, the present embodiment makes it possible to achieve a faster write speed when there are refresh cells at a high proportion.

Figure 24:
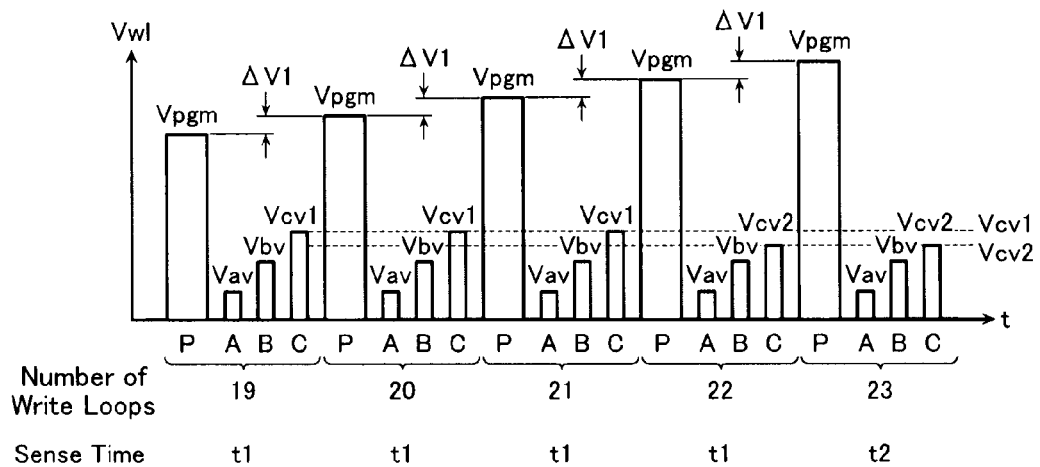
FIG. 24 is a diagram showing the relation between the number of write loops and the sense time at the time of the write sequence in the nonvolatile semiconductor memory device according to the same embodiment.

Further, the present embodiment may be used in combination with the modification of the verify voltage in the first embodiment. For example, the number of neglected bits is increased in the write loops from the 20th up and the sense time is shortened in the write loops from the 23rd up (FIG. 24). In this case, it is possible to apply the program voltage to the memory cells close to the relieved number of neglected bits. As a result, it is possible to exert the effect more greatly on the possibility of holding the retention characteristic and suppressing the occurrence of write failures.

Figure 25:
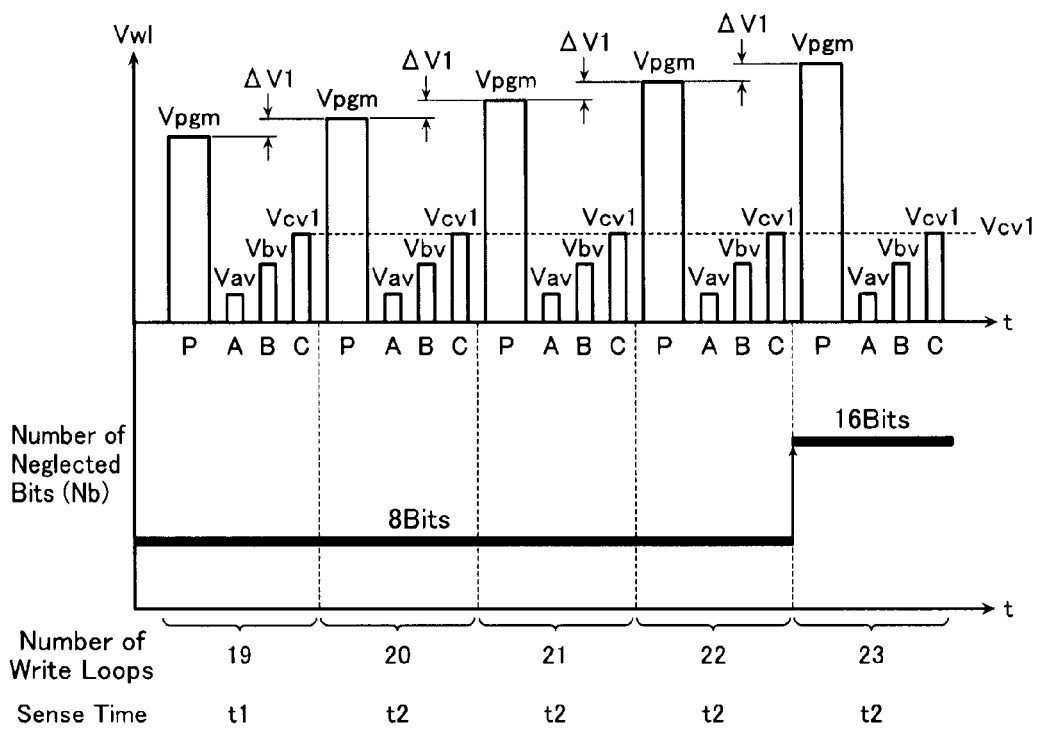
FIG. 25 is a diagram showing the relation between the number of write loops, the number of neglected bits and the sense time at the time of the write sequence in the nonvolatile semiconductor memory device according to the same embodiment.

On the other hand, the sense time may be shortened in the write loops from the 20th up and the number of neglected bits may be increased in the write loops from the 23rd up (FIG. 25). In this case, it is possible to execute writing faster.

Fifth Embodiment

A fifth embodiment describes a nonvolatile semiconductor memory device, which switches the read voltage at the time of the verify operation in accordance with the number of write loops.

Figure 26:
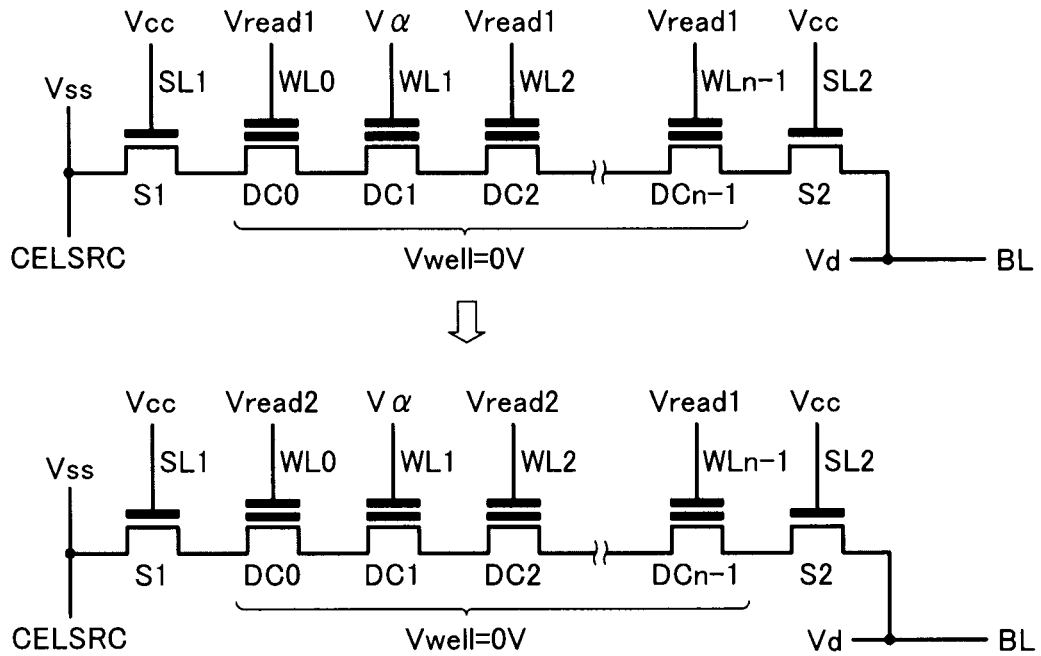
FIG. 26 is a diagram showing a bias state of a memory cell array at the time of a verify operation in a nonvolatile semiconductor memory device according to a fifth embodiment.
Figure 28:
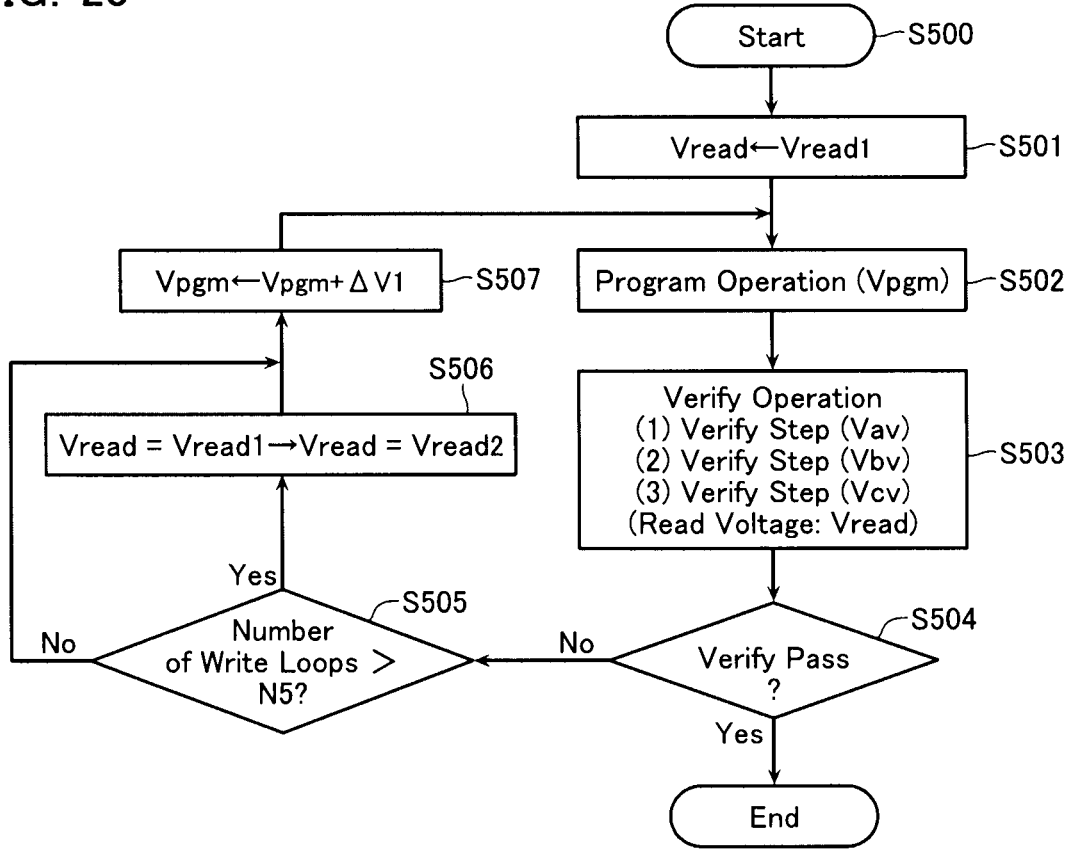
FIG. 28 is a flowchart of a write sequence in the nonvolatile semiconductor memory device according to the same embodiment.
Figure 29:
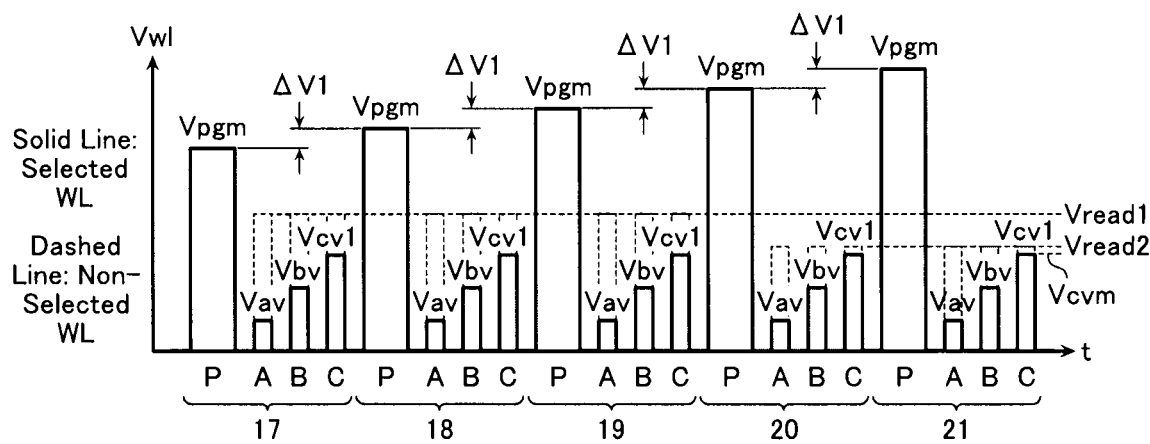
FIG. 29 is a diagram showing voltage waveforms on a word line at the time of a write sequence in the nonvolatile semiconductor memory device according to the same embodiment.

FIG. 26 is a diagram showing a variation in bias state at the time of a verify step in the nonvolatile semiconductor memory device according to the fifth embodiment. FIG. 28 is a flowchart of a write sequence according to the present embodiment. FIG. 29 is showing a voltage Vw1 applied to the selected word line and the read voltage applied to the non-selected word line at the time of a write sequence in the present embodiment. In FIG. 29, the dashed line shows the read voltage applied to non-selected word line.

At the start, the controller 11 sends a write command to the logic control circuit 6. The logic control circuit 6 controls the sequence control circuit 7 so that it executes the write sequence (step S500). The sequence control circuit 7 applies Vread1 (first read voltage) to initialize the read voltage Vread (step S501), and then executes a program operation using the program voltage Vpgm (step S502).

As for subsequent steps S503 and S504, they are similar to the steps S153 and S154 in FIG. 9 and accordingly omitted from the following description. Though, the verify voltage for C level is constant at Vbc1.

Subsequently, it determines if the number of write loops is higher than N5 (step S505). The number of times N5 may be stored in the ROM fuse area 1a or may be sent together with the write command from the controller 11. In the example of FIG. 7, the number of times N5 is 20. If the number of write loops is higher than N5 (Yes at step S505), the sequence control circuit 7 modifies the read voltage Vread to Vread2 (second read voltage) from Vread1 (step S506). On the other hand, if the number of write loops is equal to or lower than N5 (No at step S505), the sequence control circuit 7 shifts processing to step S507 without modifying the read voltage Vread.

Subsequently, the sequence control circuit 7 steps up the program voltage Vpgm by ΔV1 (step S507). Then, the sequence control circuit 7 returns processing to step S502 again, and repeatedly executes the write loop.

As above, in the write loops up to the N5-th, as shown in the upper part of FIG. 26, non-selected word lines WL are applied with a certain read voltage Vread1 at the time of the verify step. In the write loops from the (N5+1)-th up, as shown in the lower part of FIG. 26, non-selected word lines WL are applied with a read voltage Vread2 lower than the read voltage Vread1 at the time of the verify step to execute the verify step.

In this case, the second memory cell regarded as the fresh cell is lower in the read voltage than the first memory cell regarded as the cycled cell. To the extent, cell current is hard to flow in the memory cell MC. As a result, the threshold voltage Vth of the memory cell MC is observed higher. In a word, the fresh cell rather than the cycled cell can make verify-pass easier.

Thus, in accordance with the present embodiment, similar to the first embodiment, it is possible to reduce write failures in the fresh cells without loss of the reliability of data in the cycled cells. In addition, in the case of the present embodiment, the read voltage Vread is lowered when the number of write loops is high. As a result, power consumption can be reduced when the fresh cells are at a high proportion.

Figure 27:
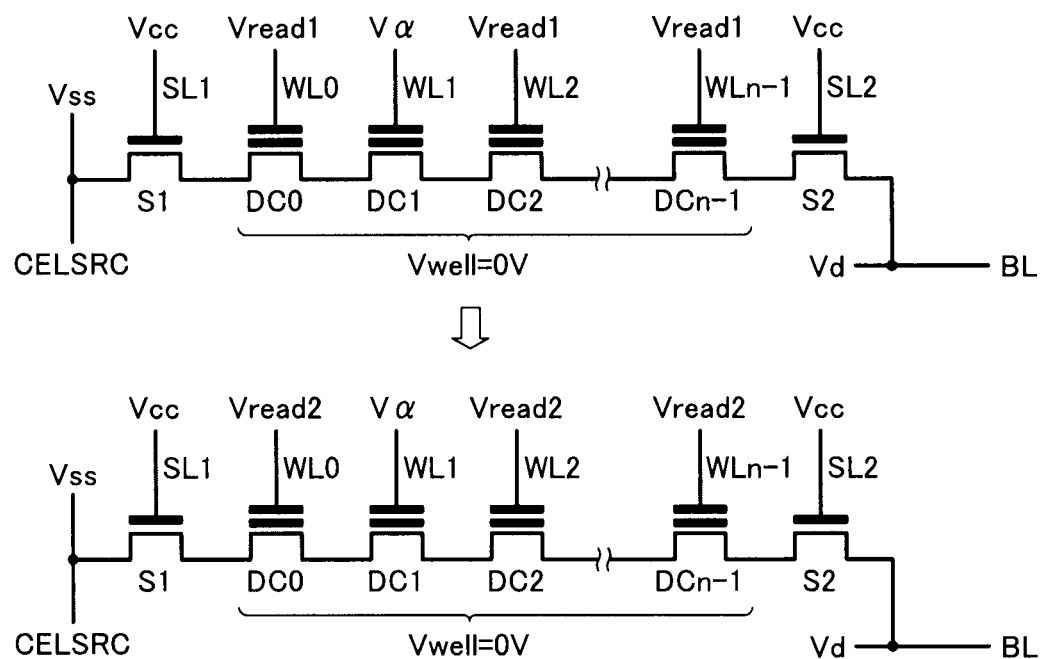
FIG. 27 is a diagram showing a bias state of the memory cell array at the time of the verify operation in the nonvolatile semiconductor memory device according to the same embodiment.

In the example shown in FIG. 26, the read voltages on non-selected word lines WL are all switched from Vread to Vread2. Though, only the read voltage applied to 1 or 2 or more non-selected word lines adjacent to the selected word line may be switched (FIG. 27).

Figure 30:
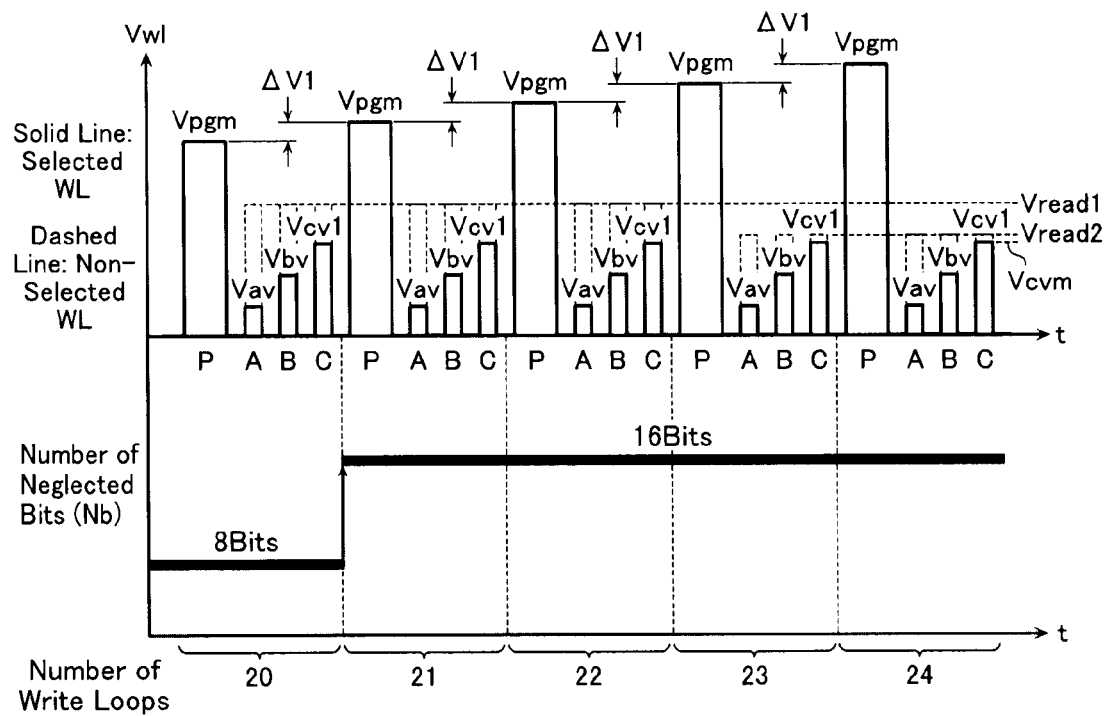
FIG. 30 is a diagram showing the relation between the number of write loops and the number of neglected bits at the time of the write sequence in the nonvolatile semiconductor memory device according to the same embodiment.

Further, the present embodiment may be used in combination with the modification of the verify voltage in the first embodiment. For example, the number of neglected bits is increased in the write loops from the 21th up and the read voltage Vread is lowered in the write loops from the 23rd up (FIG. 30). In this case, it is possible to apply the program voltage to the memory cells close to the relieved number of neglected bits. As a result, it is possible to exert the effect more greatly on the possibility of holding the retention characteristic and suppressing the occurrence of write failures.

Figure 31:
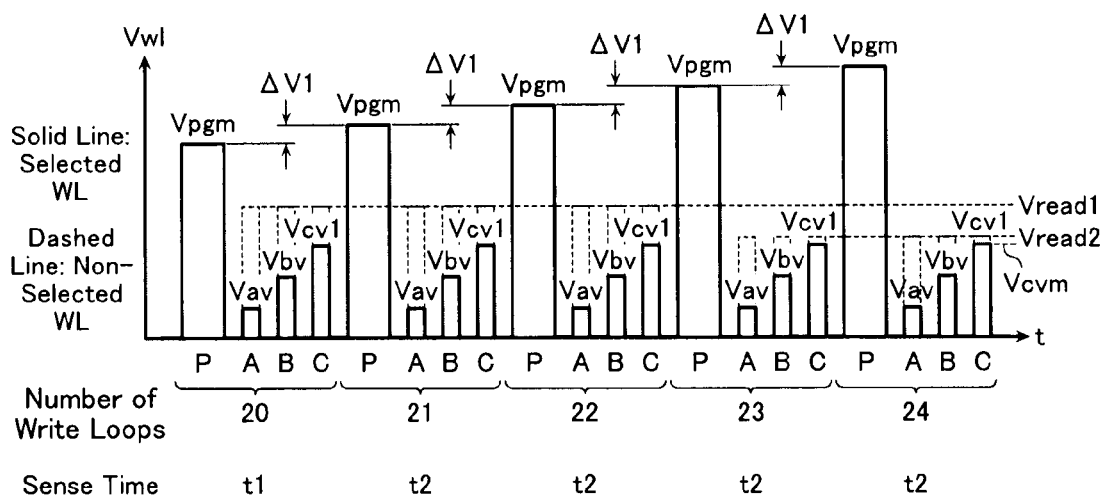
FIG. 31 is a diagram showing the relation between the number of write loops and the sense time at the time of the write sequence in the nonvolatile semiconductor memory device according to the same embodiment.

On the other hand, the sense time may be shortened in the write loops from the 21th up and the read voltage Vread may be lowered in the write loops from the 23rd up (FIG. 31). In this case, it is possible to execute writing faster.

Sixth Embodiment

A sixth embodiment describes a nonvolatile semiconductor memory device, which executes the verify operation while switching the well voltage in accordance with the number of write loops.

Figure 32:
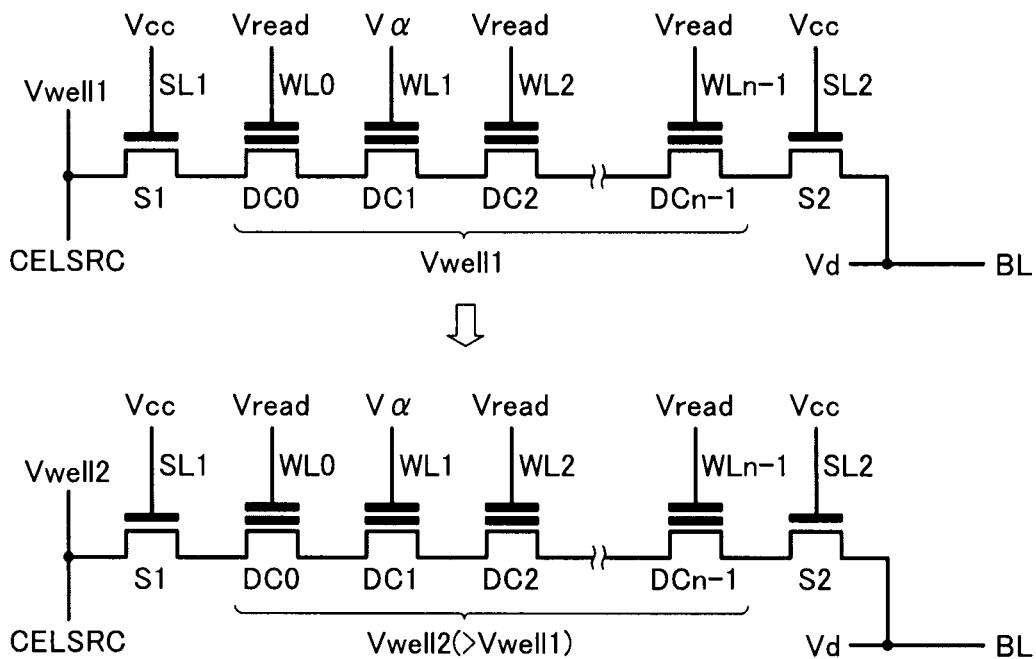
FIG. 32 is a diagram showing a bias state of a memory cell array at the time of a verify operation in a nonvolatile semiconductor memory device according to a sixth embodiment.
Figure 33:
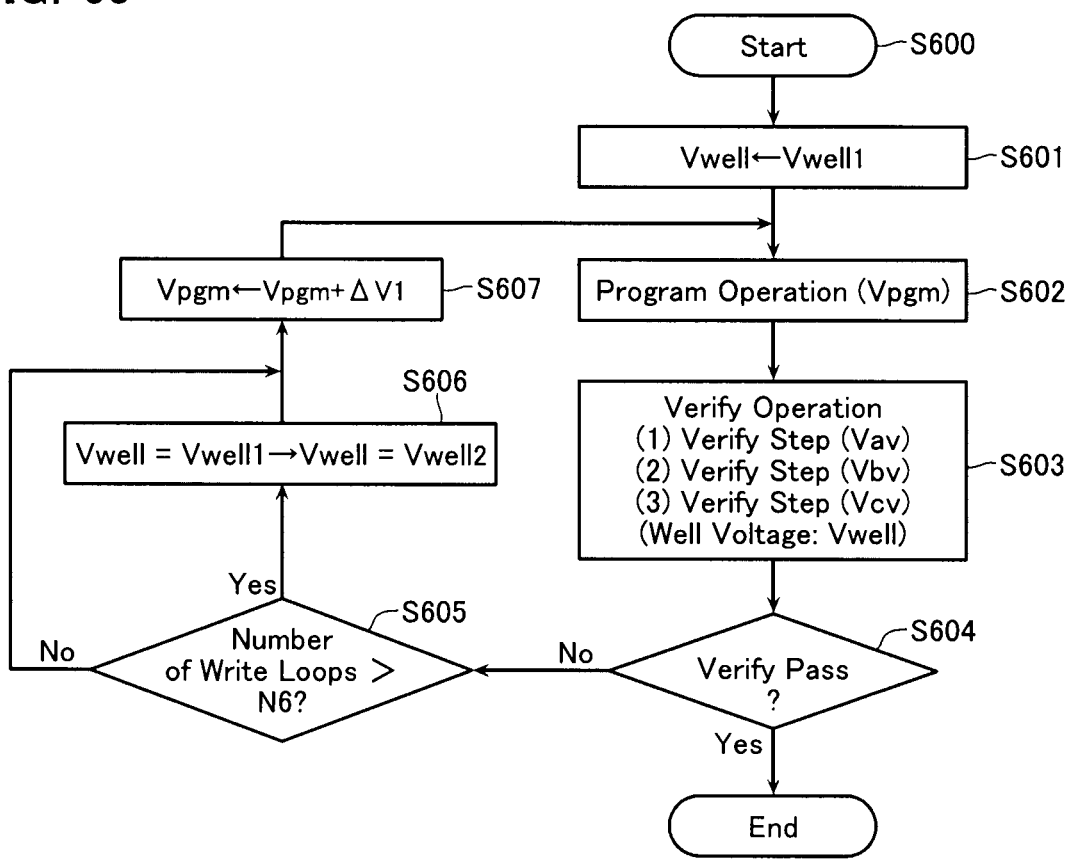
FIG. 33 is a flowchart of a write sequence in the nonvolatile semiconductor memory device according to the same embodiment.
Figure 34:
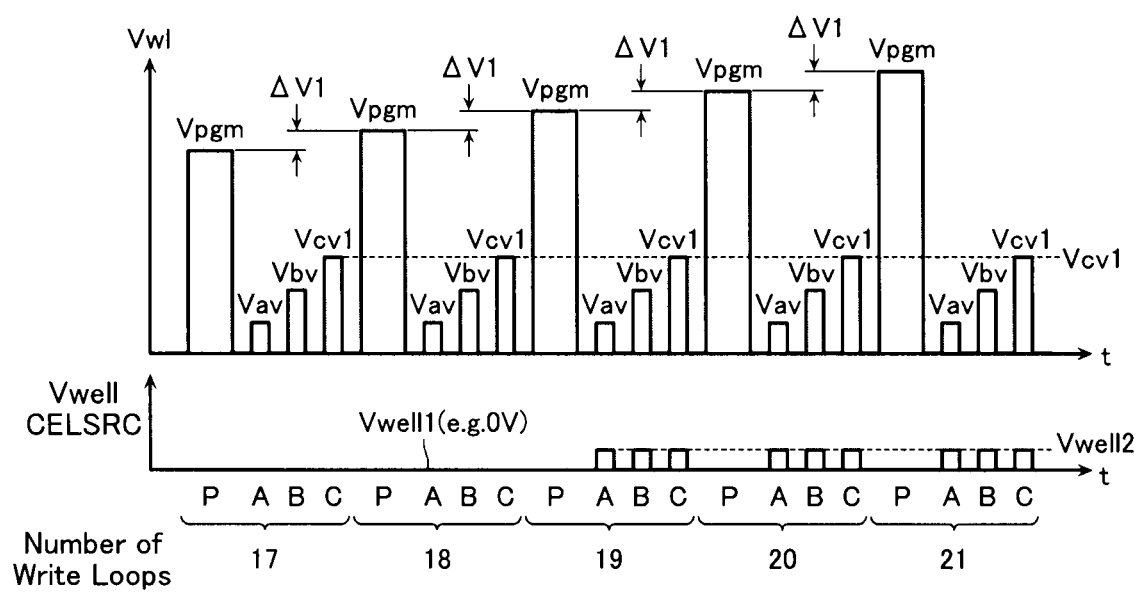
FIG. 34 is a diagram showing voltage waveforms on a word line at the time of the write sequence in the nonvolatile semiconductor memory device according to the same embodiment.

FIG. 32 is a diagram showing a variation in bias state at the time of a verify step in the nonvolatile semiconductor memory device according to the present embodiment. FIG. 33 is a flowchart of a write sequence according to the present embodiment. FIG. 34 is showing a voltage Vw1 applied to the selected word line and the well voltage Vwell in the memory cell and the voltage on the source line CELSRC at the time of a write sequence in the second embodiment.

At the start, the controller 11 sends a write command to the logic control circuit 6. The logic control circuit 6 controls the sequence control circuit 7 so that it executes the write sequence (step S600). The sequence control circuit 7 applies Vwell1 (first well voltage) to initialize the well voltage Vwell (step S601), and then executes a program operation using the program voltage Vpgm (step S602).

As for subsequent steps S603 and S604, they are similar to the steps S153 and S154 in FIG. 9 and accordingly omitted from the following description. Though, the verify voltage for C level is constant at Vbc1.

Subsequently, it determines if the number of write loops is higher than N6 (step S605). The number of times N6 may be stored in the ROM fuse area 1a or may be sent together with the write command from the controller 11. In the example of FIG. 34, the number of times N6 is 20. If the number of write loops is higher than N6 (Yes at step S605), the sequence control circuit 7 modifies the well voltage Vwell to Vwell2 (second well voltage) from Vwell1 (step S606). On the other hand, if the number of write loops is equal to or lower than N6 (No at step S605), the sequence control circuit 7 shifts processing to step S607 without modifying the read voltage Vwell.

Subsequently, the sequence control circuit 7 steps up the program voltage Vpgm by ΔV1 (step S607). Then, the sequence control circuit 7 returns processing to step S602 again, and repeatedly executes the write loop.

As above, in the write loops up to the N6-th, as shown in the upper part of FIG. 32, a certain well voltage Vwell1 is used to execute the verify operation. In the write loops from the (N6+1)-th up, as shown in the lower part of FIG. 32, a well voltage Vwell2 higher than the well voltage Vwell1 is used to execute the verify operation.

In this case, the second memory cell regarded as the fresh cell is higher in the voltage on the source line CELSRC and the well voltage Vwell than the first memory cell regarded as the cycled cell. As a result, the threshold voltage is substantially observed higher. In a word, the fresh cell rather than the cycled cell can make verify-pass easier.

Thus, in accordance with the present embodiment, similar to the first embodiment, it is possible to reduce write failures in the fresh cells without loss of the reliability of data in the cycled cells. In addition, in the case of the present embodiment, it is possible to exert the effect on lowering not only the verify voltage Vcv but also the verify voltages Vca, Vcb substantially at the same time. In particular, it is effective on writing A level, or B level and C level at the same time (for example, a program voltage for A level and a program voltage for B level and C level are applied successively to execute the verify at A-C levels). As a result, also at A level, B level, it is possible to reduce write failures in the fresh cells without loss of the reliability of data in the cycled cells.

Further, the present embodiment may be used in combination with the modification of the verify voltage in the first embodiment.

[Others]

While certain embodiments have been described, these embodiments have been presented by way of example only, and are not intended to limit the scope of the inventions.

Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device, comprising:
   a memory cell array including plural memory cells each configured capable of storing data nonvolatilely in accordance with plural different threshold voltage distributions; and
   a control unit operative to, in data write to said memory cell, execute write loops each including a program operation for changing a threshold voltage of said memory cell and a verify operation for detecting said threshold voltage of said memory cell after said program operation,
   said control unit, in data write for changing said threshold voltage of said memory cell into an uppermost threshold voltage distribution of said plural threshold voltage distributions, executing said verify operation, using a first verify voltage when the number of write loops is equal to or less than a first number, and using a second verify voltage lower than said first verify voltage when the number of write loops is more than said first number, and
   said control unit, in data write for changing said threshold voltage of said memory cell into one of said plural threshold voltage distributions except for the uppermost threshold voltage distribution, not changing a verify voltage in accordance with the number of write loops.

2. The nonvolatile semiconductor memory device according to claim 1, wherein
   said control unit, in said verify operation in data write to said memory cells,
      uses a pass condition for said verify operation that the number of said memory cells having said threshold voltage lower than a first or second verify voltage is equal to or less than a first number of neglected bits when the number of write loops is equal to or less than a second number, and
      uses a pass condition for said verify operation that the number of said memory cells having said threshold voltage lower than a first and second verify voltage is equal to or less than a second number of neglected bits more than said first number of neglected bits when the number of write loops is more than said second number.

3. The nonvolatile semiconductor memory device according to claim 1, wherein
   said memory cell array includes a bit line electrically connected to said memory cell, and
   said control unit, in said verify operation in data write to said memory cell,
      detects said threshold voltage of said memory cell using a first sense time for a bit line voltage elapsed after beginning of said verify operation when the number of write loops is equal to or less than a third number, and
      detects said threshold voltage of said memory cell using a second sense time for a bit line voltage shorter than said first sense time elapsed after the beginning of said verify operation when the number of write loops is more than said third number.

4. The nonvolatile semiconductor memory device according to claim 1, wherein
   said memory cell array includes a bit line, plural word lines, and a source line, said plural memory cells are serially-connected between said bit line and said source line, and said serially-connected memory cells are connected to said plural word lines, and
   said control unit, in said verify operation in data write to said memory cell,
      applies a first read voltage to said word lines connected to non-selected memory cells when the number of write loops is equal to or less than a fourth number, and
      applies a second read voltage lower than said first read voltage to said word lines connected to said non-selected memory cells when the number of write loops is more than said fourth number.

5. The nonvolatile semiconductor memory device according to claim 1, wherein
   each memory cell includes a transistor formed on a well, and
   said control unit, in said verify operation in data write to said memory cell,
      applies a first well voltage to said well when the number of write loops is equal to or less than a fifth number, and
      applies a second well voltage higher than said first well voltage to said well when the number of write loops is more than said fifth number.

6. A nonvolatile semiconductor memory device, comprising:
   a memory cell array including plural memory cells each configured capable of storing data nonvolatilely in accordance with plural different threshold voltage distributions; and
   a control unit operative to, in data write to said memory cell, execute write loops each including a program operation for changing a threshold voltage of said memory cell and a verify operation for detecting said threshold voltage of said memory cell after said program operation,
   said control unit, in said program operation in data write to said memory cell,
      stepping up a program voltage by first step widths when the number of write loops is equal to or less than a sixth number, and
      stepping up said program voltage by second step widths larger than said first step widths when the number of write loops is more than said sixth number.

7. The nonvolatile semiconductor memory device according to claim 1, wherein
   said control unit, in said program operation in data write to said memory cell,
      steps up a program voltage by third step widths when the number of write loops is equal to or less than a seventh number, and
      steps up said program voltage by fourth step widths smaller than said third step widths when the number of write loops is more than said seventh number.

8. The nonvolatile semiconductor memory device according to claim 1, wherein
   said memory cell array includes plural pages having a certain number of said memory cells, and said plural pages include a first page and a second page, and
   said control unit, in said verify operation in data write to said first page and said second page where the number of write/erase times in said first page is more than the number of write/erase times in said second page,
uses said first verify voltage in common for said first page and said second page when the number of write loops is equal to or less than said first number, and
uses said second verify voltage for said second page when the number of write loops is more than said first number.

9. The nonvolatile semiconductor memory device according to claim 2, wherein
said memory cell array includes plural pages having a certain number of said memory cells, and said plural pages include a third page and a fourth page, and
said control unit, in said verify operation in data write to said third page and said fourth page where the number of write/erase times in said third page is more than the number of write/erase times in said fourth page,
uses a pass condition for said verify operation that the number of said memory cells having said threshold voltage lower than said first verify voltage is equal to or less than said first number of neglected bits in common for said third page and said fourth page when the number of write loops is equal to or less than said second number, and
uses the pass condition for said verify operation that the number of said memory cells having said threshold voltage lower than said first or second verify voltage is equal to or less than said second number of neglected bits for said fourth page when the number of write loops is more than said second number.

10. The nonvolatile semiconductor memory device according to claim 1, wherein
each memory cell is configured capable of storing data of four values nonvolatilely in accordance with a first threshold voltage distribution, a second threshold voltage distribution, a third threshold voltage distribution, and a fourth threshold voltage distribution that have respective values ascending in an order of the first, second, third and fourth threshold voltage distributions, said first threshold voltage distribution being formed in the memory cell caused to perform data erase and said fourth threshold voltage distribution corresponding to the uppermost threshold voltage distribution.

11. The nonvolatile semiconductor memory device according to claim 10, wherein
said control unit executes said verify operation not changing the verify voltage in accordance with the number of write loops in data write for changing said threshold voltage of said memory cell into said second threshold voltage distribution and said third threshold voltage distribution.

12. The nonvolatile semiconductor memory device according to claim 10, wherein
said memory cell array includes a word line connected to said memory cell, and said control unit executes said verify operation by applying the word line with a pulse of the second verify voltage disconnected to another pulse of a different voltage from the second verify voltage when the number of write loops is more than said first number.

13. A nonvolatile semiconductor memory device, comprising:
a memory cell array including plural memory cells each configured capable of storing data nonvolatilely in accordance with plural different threshold voltage distributions; and
a control unit operative to, in data write to said memory cell, execute write loops each including a program operation for changing a threshold voltage of said memory cell and a verify operation for detecting said threshold voltage of said memory cell after said program operation,
said memory cell array including a bit line electrically connected to said memory cell, and
said control unit, in data write for changing said threshold voltage of said memory cell into the uppermost threshold voltage distribution of said plural threshold voltage distributions, executing said verify operation by detecting said threshold voltage of said memory cell using a third sense time for a bit line voltage elapsed after beginning of said verify operation when the number of write loops is equal to or less than an eighth number, and detecting said threshold voltage of said memory cell using a fourth sense time for a bit line voltage shorter than said third sense time elapsed after the beginning of said verify operation when the number of write loops is more than said eighth number.

14. The nonvolatile semiconductor memory device according to claim 13, wherein
said control unit, in said verify operation in data write to said memory cells,
uses a pass condition for said verify operation that the number of said memory cells having said threshold voltage lower than a certain verify voltage is equal to or less than a third number of neglected bits when the number of write loops is equal to or less than a ninth number, and
uses a pass condition for said verify operation that the number of said memory cells having said threshold voltage lower than said certain verify voltage is equal to or less than a fourth number of neglected bits more than said third number of neglected bits when the number of write loops is more than said ninth number.

15. The nonvolatile semiconductor memory device according to claim 13, wherein
said memory cell array includes plural pages having a certain number of said memory cells, and said plural pages include a fifth page and a sixth page, and
said control unit, in said verify operation in data write to said fifth page and said sixth page where the number of write/erase times in said fifth page is more than the number of write/erase times in said sixth page,
uses said third sense time in common for said fifth page and said sixth page when the number of write loops is equal to or less than said eighth number, and
uses said fourth sense time for said sixth page when the number of write loops is more than said eighth number.

16. A nonvolatile semiconductor memory device, comprising:
a memory cell array including plural memory cells each configured capable of storing data nonvolatilely in accordance with plural different threshold voltage distributions; and
a control unit operative to, in data write to said memory cell, execute write loops each including a program operation for changing a threshold voltage of said memory cell and a verify operation for detecting said threshold voltage of said memory cell after said program operation,
said memory cell array including a bit line, plural word lines, and a source line, said plural memory cells being serially-connected between said bit line and said source line, and said serially-connected memory cells being connected to said plural word lines, and said control unit, in data write for changing said threshold voltage of said memory cell into the uppermost threshold voltage distribution of said plural threshold voltage distributions, executing said verify operation by applying a third read voltage to said word lines connected to non-selected memory cells when the number of write loops is equal to or less than a tenth number, and applying a fourth read voltage lower than said third read voltage to said word lines connected to said non-selected memory cells when the number of write loops is more than said tenth number.

17. The nonvolatile semiconductor memory device according to claim 16, wherein said memory cell array includes plural pages having a certain number of said memory cells, and said plural pages include a seventh page and an eighth page, and said control unit, in said verify operation in data write to said seventh page and said eighth page where the number of write/erase times in said seventh page is more than the number of write/erase times in said eighth page, uses said third read voltage in common for said seventh page and said eighth page when the number of write loops is equal to or less than said tenth number, and uses said fourth read voltage for said eighth page when the number of write loops is more than said tenth number.

18. A nonvolatile semiconductor memory device, comprising:

a memory cell array including plural memory cells each configured capable of storing data nonvolatilely in accordance with plural different threshold voltage distributions; and a control unit operative to, in data write to said memory cell, execute write loops each including a program operation for changing a threshold voltage of said memory cell and a verify operation for detecting said threshold voltage of said memory cell after said program operation, each memory cell including a transistor formed on a well, and said control unit, in data write for changing said threshold voltage of said memory cell into the uppermost threshold voltage distribution of said plural threshold voltage distributions, executing said verify operation by applying a third well voltage to said well when the number of write loops is equal to or less than an eleventh number, and applying a fourth well voltage higher than said third well voltage to said well when the number of write loops is more than said eleventh number.

19. The nonvolatile semiconductor memory device according to claim 18, wherein said memory cell array includes plural pages having a certain number of said memory cells, and said plural pages include a ninth page and a tenth page, and said control unit, in said verify operation in data write to said ninth page and said tenth page where the number of write/erase times in said ninth page is more than the number of write/erase times in said tenth page, uses said third well voltage in common for said ninth page and said tenth page when the number of write loops is equal to or less than said eleventh number, and uses said fourth well voltage for said tenth page when the number of write loops is more than said eleventh number.

* * * * *